US012660723B2

(12) United States Patent
Suk et al.

(10) Patent No.: US 12,660,723 B2
(45) Date of Patent: Jun. 16, 2026

(54) SEMICONDUCTOR PACKAGE AND METHOD OF FABRICATING THE SAME

(71) Applicant: Samsung Electronics Co., Ltd., Suwon-si (KR)

(72) Inventors: Kyoung Lim Suk, Suwon-si (KR); Dongkyu Kim, Suwon-si (KR); Ji Hwang Kim, Suwon-si (KR); Hyeonjeong Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 360 days.

(21) Appl. No.: 18/227,348

(22) Filed: Jul. 28, 2023

(65) Prior Publication Data

US 2024/0178114 A1 May 30, 2024

(30) Foreign Application Priority Data

Nov. 28, 2022 (KR) ........................ 10-2022-0161832

(51) Int. Cl.
| | |
|---|---|
| *H01L 23/498* | (2006.01) |
| *H01L 21/56* | (2006.01) |
| *H01L 23/00* | (2006.01) |

(52) U.S. Cl.
CPC ...... *H01L 23/49816* (2013.01); *H01L 21/565* (2013.01); *H01L 21/568* (2013.01); (Continued)

(58) Field of Classification Search
CPC ............. H01L 23/49816; H01L 21/565; H01L 21/568; H01L 23/49822; H01L 24/16;

H01L 24/32; H01L 2224/16055; H01L 2224/16227; H01L 2224/32146; H01L 2224/32235; H01L 2924/1435; H01L 2924/15311; H01L 2924/351; H01L 21/6835; H01L 23/3128; H01L 23/5389; H01L 24/19; H01L 23/481; H01L 23/3738; H01L 23/4824; H01L 23/485; (Continued)

(56) References Cited

U.S. PATENT DOCUMENTS

| | | | |
|---|---|---|---|
| 7,838,337 B2 * | 11/2010 | Marimuthu | ......... H01L 21/6835 257/E21.511 |
| 9,299,649 B2 | 3/2016 | Chiu et al. | |

(Continued)

*Primary Examiner* — Vu A Vu
(74) *Attorney, Agent, or Firm* — Muir Patent Law, PLLC

(57) ABSTRACT

Disclosed are semiconductor packages and their fabrication methods. The semiconductor package comprises a lower semiconductor chip on a first redistribution substrate and including a through via, a lower molding layer on the first redistribution substrate and surrounding the lower semiconductor chip, a lower post on the first redistribution substrate and laterally spaced apart from the lower semiconductor chip, an upper semiconductor chip on the lower semiconductor chip and coupled to the through via, an upper molding layer on the lower molding layer and surrounding the upper semiconductor chip, an upper post on the lower molding layer and laterally spaced apart from the upper semiconductor chip, and a second redistribution substrate on the upper molding layer and coupled to the upper post. A top surface of the lower molding layer is at a level higher than that of a top surface of the lower semiconductor chip.

20 Claims, 23 Drawing Sheets

(52) U.S. Cl.
CPC ........ *H01L 23/49822* (2013.01); *H01L 24/16*
(2013.01); *H01L 24/32* (2013.01); *H01L*
*2224/16055* (2013.01); *H01L 2224/16227*
(2013.01); *H01L 2224/32146* (2013.01); *H01L*
*2224/32235* (2013.01); *H01L 2924/1435*
(2013.01); *H01L 2924/15311* (2013.01); *H01L*
*2924/351* (2013.01)

(58) Field of Classification Search
CPC .............. H01L 23/49827; H01L 24/03; H01L
24/81; H01L 2224/0231; H01L
2224/02331; H01L 2224/02333; H01L
2224/02372; H01L 2224/02381; H01L
25/0657; H01L 23/3171; H01L 23/3185;
H01L 24/07; H01L 25/50; H01L
2224/0235; H01L 2224/02373; H01L
2224/02379; H01L 2225/06541; H01L
2225/06548; H01L 2225/06568; H01L
2225/06589

USPC .......................................................... 257/738
See application file for complete search history.

(56)                    References Cited

U.S. PATENT DOCUMENTS

| | | | |
|---|---|---|---|
| 9,559,081 B1 | 1/2017 | Lai et al. | |
| 9,583,460 B2 | 2/2017 | Ray et al. | |
| 9,583,472 B2 | 2/2017 | Chung et al. | |
| 9,601,471 B2* | 3/2017 | Zhai | H01L 23/5389 |
| 9,633,974 B2 | 4/2017 | Zhai et al. | |
| 9,831,148 B2* | 11/2017 | Yu | H01L 24/20 |
| 9,935,087 B2* | 4/2018 | Zhai | H01L 24/82 |
| 10,475,770 B2* | 11/2019 | Lee | H01L 23/3128 |
| 10,546,830 B2* | 1/2020 | Jeng | H01L 24/20 |
| 10,636,773 B2* | 4/2020 | Kuo | H01L 25/105 |
| 11,887,930 B2* | 1/2024 | Lee | H01L 24/19 |
| 2012/0056312 A1* | 3/2012 | Pagaila | H01L 23/3128 |
| | | | 257/E23.116 |
| 2021/0280523 A1 | 9/2021 | We et al. | |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0161832, filed on Nov. 28, 2022, in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a redistribution substrate and a method of fabricating the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

With the development of electronic industry, electronic products have increasingly demands for high performance, high speed, and compact size. To meet the trend, there has recently been developed a packaging technology in which a plurality of semiconductor chips are mounted in a single package.

Portable devices have been increasingly demanded in recent electronic product markets, and as a result, there has been increased demand for reduction in size and weight of electronic parts mounted on the portable devices. In order to accomplish the reduction in size and weight of the electronic parts, there is need for technology to integrate a number of individual devices into a single package as well as technology to reduce individual sizes of mounting parts. In particular, semiconductor packages operated at high frequency signals are required to have compactness and excellent electrical characteristics.

SUMMARY

Some embodiments of the present inventive concepts provide a semiconductor package with improved thermal radiation and a method of fabricating the same.

Some embodiments of the present inventive concepts provide a semiconductor package with improved structural properties and a method of fabricating the same.

Some embodiments of the present inventive concepts provide a semiconductor package fabrication method with simplified process and less occurrence of failure and a semiconductor package fabricated by the same.

According to an embodiment of the present inventive concepts, a semiconductor package may comprise: a first redistribution substrate; a lower semiconductor chip on the first redistribution substrate and including a through via therein; a lower molding layer on the first redistribution substrate and surrounding the lower semiconductor chip; a lower post on the first redistribution substrate and laterally spaced apart from the lower semiconductor chip, the lower post vertically penetrating the lower molding layer; an upper semiconductor chip on the lower semiconductor chip and coupled to the through via; an upper molding layer on the lower molding layer and surrounding the upper semiconductor chip; an upper post on the lower molding layer and laterally spaced apart from the upper semiconductor chip, the upper post vertically penetrating the upper molding layer and being coupled to the lower post; and a second redistribution substrate on the upper molding layer and coupled to the upper post. A top surface of the lower molding layer may be at a level higher than a level of a top surface of the lower semiconductor chip.

According to an embodiment of the present inventive concepts, a semiconductor package may comprise: a first redistribution substrate; an external terminal on a bottom surface of the first redistribution substrate; a lower semiconductor chip on the first redistribution substrate and including a through via therein; a lower post on the first redistribution substrate and laterally spaced apart from the lower semiconductor chip, the lower post being coupled to the first redistribution substrate; an upper semiconductor chip on the lower semiconductor chip and coupled to the through via; an upper post on the lower post and laterally spaced apart from the upper semiconductor chip; a second redistribution substrate on the upper semiconductor chip and the upper post, the second redistribution substrate being coupled to the upper post; and a passivation layer that covers a top surface of the lower semiconductor chip and extends across between the lower post and the upper post. The lower post may penetrate the passivation layer to be connected to the upper post.

According to an embodiment of the present inventive concepts, a semiconductor package may comprise: a first redistribution substrate; a lower semiconductor chip on the first redistribution substrate and including a through via therein; a lower molding layer on the first redistribution substrate and surrounding the lower semiconductor chip; a passivation layer that covers a top surface of the lower semiconductor chip and a top surface of the lower molding layer, the through via of the lower semiconductor chip vertically penetrating the passivation layer to be exposed on a top surface of the passivation layer; an upper semiconductor chip on the passivation layer on the lower semiconductor chip, the upper semiconductor chip being coupled to the through via; an upper molding layer on the passivation layer and surrounding the upper semiconductor chip; and a second redistribution substrate on the upper molding layer. The top surface of the lower semiconductor chip may constitute a recess that is recessed toward the first redistribution substrate from the top surface of the lower molding layer.

According to an embodiment of the present inventive concepts, a method of fabricating a semiconductor package may comprise: mounting a lower semiconductor chip on a first redistribution substrate; placing a lower post on the first redistribution substrate; forming on the first redistribution substrate a lower molding layer that covers the lower semiconductor chip and the lower post; performing a thinning process on the lower molding layer to expose a top surface of the lower semiconductor chip and a top surface of the lower post, wherein the thinning process causes the top surface of the lower semiconductor chip to be lower than a top surface of the lower molding layer; forming a passivation layer on the top surface of the lower molding layer and the top surface of the lower semiconductor chip; placing an upper semiconductor chip on the passivation layer over the lower semiconductor chip; and forming on the passivation layer an upper molding layer that covers the upper semiconductor chip.

BRIEF DESCRIPTION OF THE DRAWINGS

FIGS. 1 to 7 illustrate cross-sectional views showing a semiconductor package according to example embodiments of the present inventive concepts.

FIGS. 8 to 23 illustrate cross-sectional views showing a method of fabricating a semiconductor package according to example embodiments of the present inventive concepts.

DETAILED DESCRIPTION OF EMBODIMENTS

The following will now describe a semiconductor package according to the present inventive concepts with reference to the accompanying drawings. Like numerals refer to like elements throughout.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Figure 1:
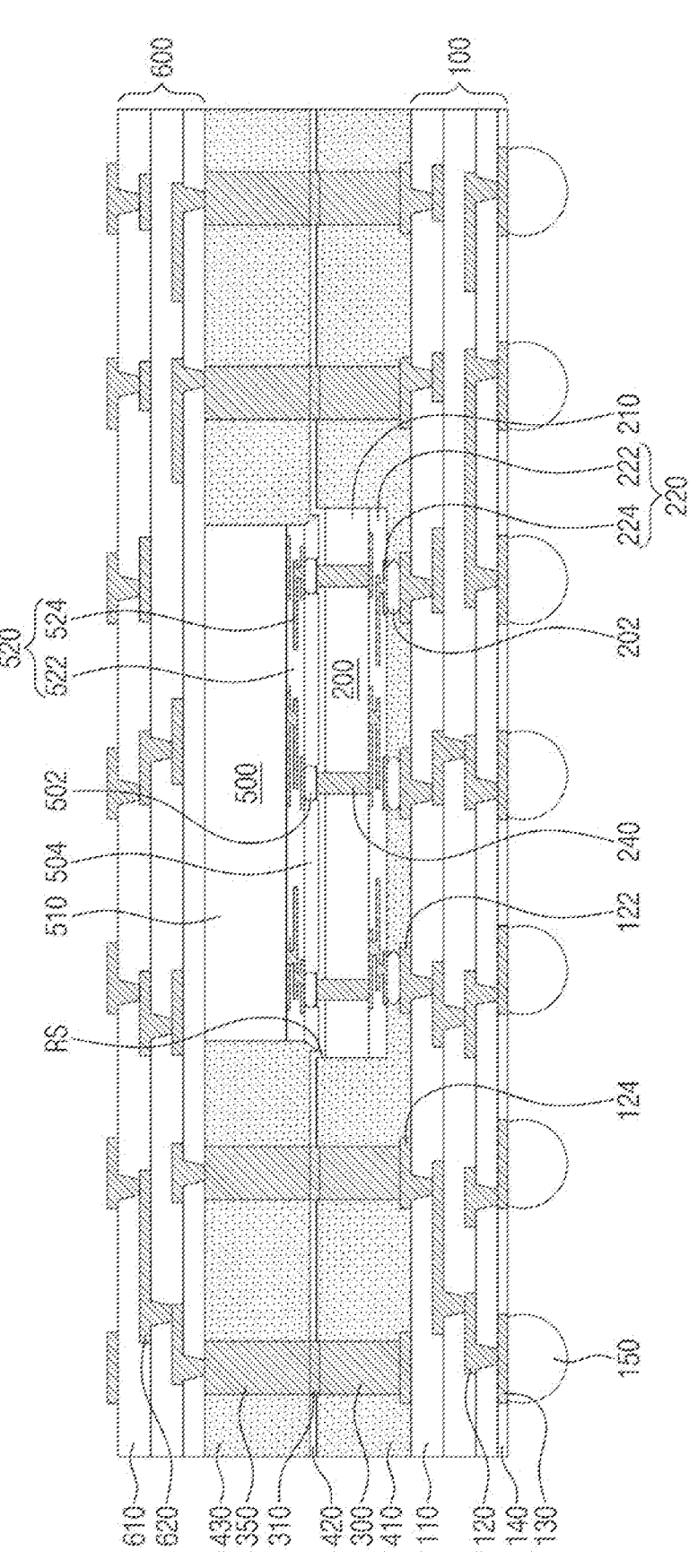
Figure 2:
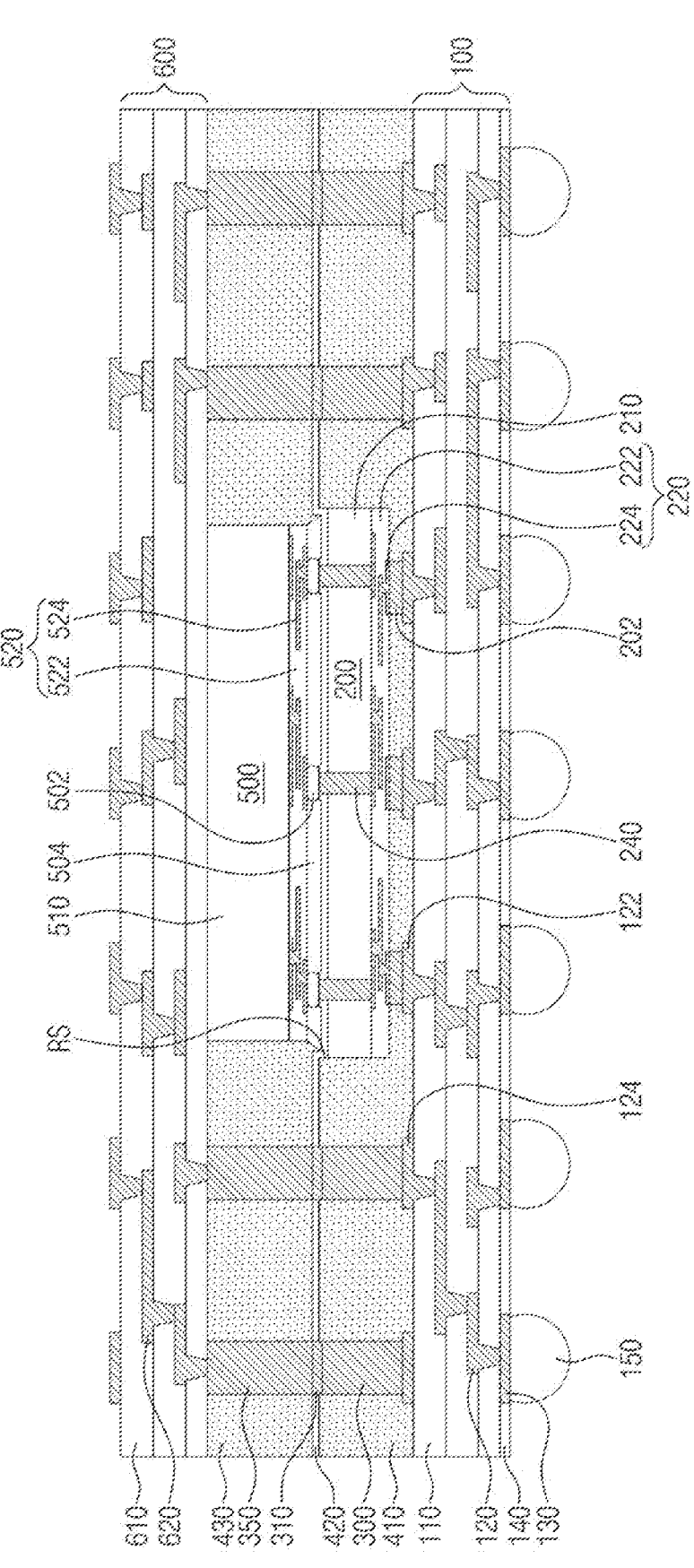
Figure 3:
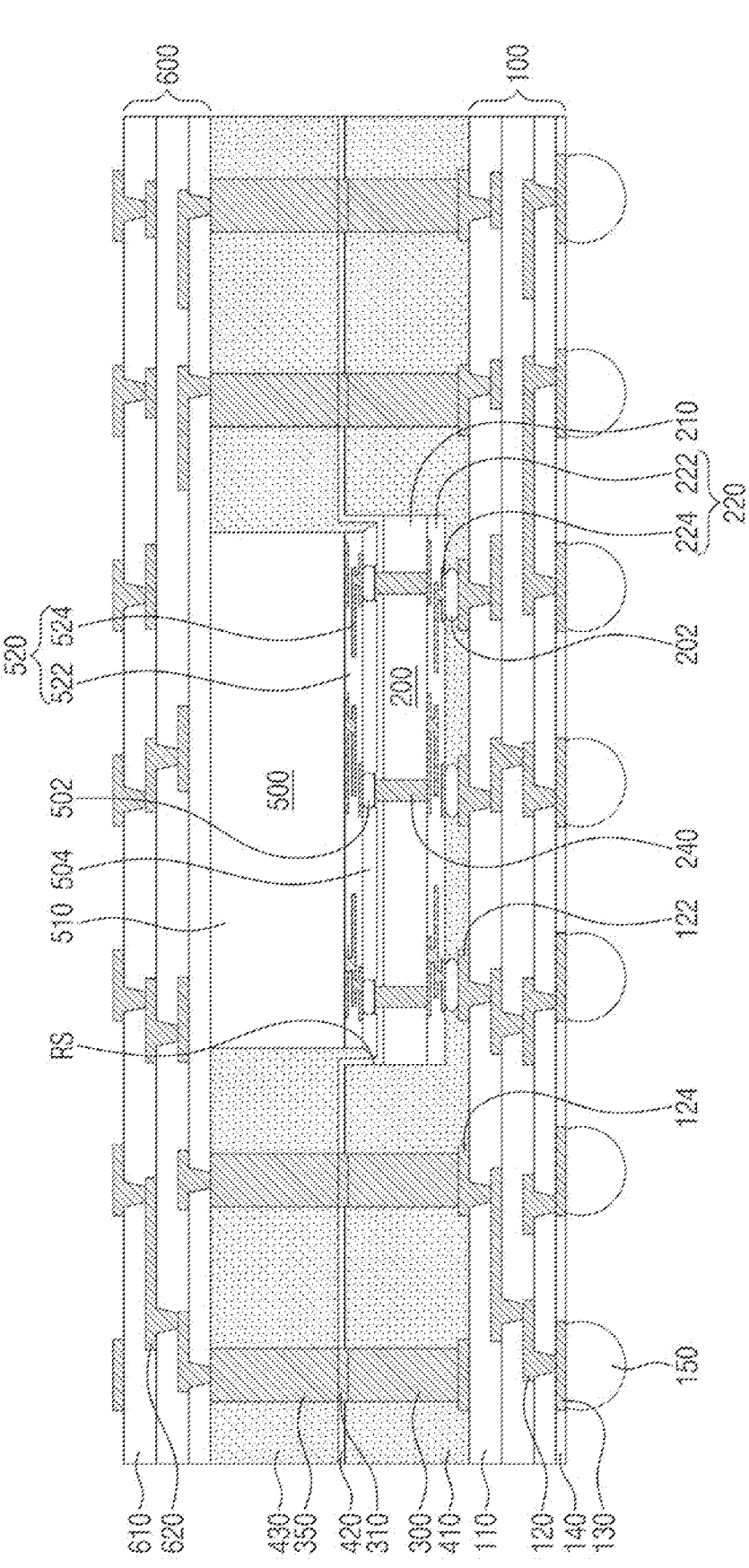

FIGS. 1 to 3 illustrate cross-sectional views showing a semiconductor package according to example embodiments of the present inventive concepts.

Referring to FIG. 1, a first redistribution substrate 100 may be provided. The first redistribution substrate 100 may be a substrate for redistribution. For example, the first redistribution substrate 100 may include one or more first substrate wiring layers that are stacked on each other. Each of the first substrate wiring layers may include a first substrate dielectric pattern 110 and a first substrate wiring pattern 120 in the first substrate dielectric pattern 110. The first substrate wiring pattern 120 in one first substrate wiring layer may be electrically connected to the first substrate wiring pattern 120 in an adjacent another first substrate wiring layer.

The first substrate dielectric pattern 110 may include a dielectric polymer or a photo-imagable dielectric (PID). For example, the photo-imagable dielectric may include at least one selected from photosensitive polyimide, polybenzoxazole (PBO), phenolic polymers, and benzocyclobutene polymers. Alternatively, the first substrate dielectric pattern 110 may include a dielectric material. For example, the first substrate dielectric pattern 110 may include silicon oxide (SiO), silicon nitride (SiN), silicon oxynitride (SiON), or dielectric polymers.

The first substrate wiring pattern 120 may be provided on the first substrate dielectric pattern 110. The first substrate wiring pattern 120 may horizontally extend on the first substrate dielectric pattern 110. The first substrate wiring pattern 120 may be provided on a top surface of the first substrate dielectric pattern 110. The first substrate wiring pattern 120 may protrude onto the top surface of the first substrate dielectric pattern 110, contacting the top surface of the first substrate dielectric pattern 110. On the first substrate dielectric pattern 110, the first substrate wiring pattern 120 may be covered with another first substrate dielectric pattern 110 disposed thereon. The first substrate wiring pattern 120 provided in an uppermost first substrate wiring layer may serve as a substrate pad to which are coupled a lower semiconductor chip 200 and lower posts 300 which will be discussed below.

For example, portions of the first substrate wiring pattern 120 provided in the uppermost first substrate wiring layer may be first substrate pads 122 on which the lower semiconductor chip 200 is mounted, and others of the first substrate wiring pattern 120 provided in the uppermost first substrate wiring layer may be second substrate pads 124 to which the lower posts 300 are coupled. In example embodiments, the lower posts 300 may contact top surfaces of the second substrate pads 124. As discussed above, the first substrate wiring pattern 120 may be a pad or line part of the first substrate wiring layer. In this sense, the first substrate wiring pattern 120 may be a component for horizontal redistribution in the first redistribution substrate 100. The first substrate wiring pattern 120 may include a conductive material. For example, the first substrate wiring pattern 120 may include metal, such as copper (Cu).

The first substrate wiring pattern 120 may have a damascene structure. For example, the first substrate wiring pattern 120 may have a via that protrudes from a bottom surface thereof. The via may be a component for vertically connecting to each other the first substrate wiring patterns 120 of neighboring first substrate wiring layers. Alternatively, the via may be a component for connecting the first substrate wiring pattern 120 of a lowermost first substrate wiring layer to external pads 130 which will be discussed below. For example, the via may penetrate from the bottom surface of the first substrate wiring pattern 120 through the first substrate dielectric pattern 110 to contact a top surface of the first substrate wiring pattern 120 of an underlying another first substrate wiring layer.

For another example, the vias may penetrate from the bottom surface of the first substrate wiring pattern 120 through a lowermost first substrate dielectric pattern 110 to contact top surfaces of the external pads 130. In this configuration, an upper portion of the first substrate wiring pattern 120 positioned on the first substrate dielectric pattern 110 may be a head part used as a horizontal line or pad, and the via of the first substrate wiring pattern 120 may be a tail part. The first substrate wiring pattern 120 may have a T shape.

Although not shown, a barrier layer may be interposed between the first substrate dielectric pattern 110 and the first substrate wiring patterns 120. The barrier layer may surround the head and tail parts of the first substrate wiring patterns 120. A range of about 50 Å to about 1,000 Å may be given as a thickness of the barrier layer or a gap between the first substrate dielectric pattern 110 and the first substrate wiring patterns 120. The barrier layer may include titanium (Ti), tantalum (Ta), titanium nitride (TiN), or tantalum nitride (TaN). As used herein, the terms "thick" and "thickness" may refer to the thickness or height measured in a direction perpendicular to a top surface of the first redistribution substrate 100.

The external pads 130 may be provided on a bottom surface of the lowermost first substrate wiring layer. For example, the external pads 130 may be provided on a bottom surface of a lowermost one of the first substrate dielectric patterns 110. The external pads 130 may be electrically connected to the first substrate wiring pattern 120. The external pads 130 may contact vias corresponding to the lowermost one of the first substrate wiring patterns 120. The external pads 130 may serve as pads to which are coupled external terminals 150 which will be discussed. The external pads 130 may include a conductive material. For example, the external pads 130 may include metal, such as copper (Cu).

A substrate protection layer 140 may be provided. The substrate protection layer 140 may cover the bottom surface of the lowermost first substrate wiring layer and expose the external pads 130. For example, bottom surfaces of the external pads 130 and the substrate protection layer 140 may be coplanar. The external terminals 150 may be provided on exposed bottom surfaces of the external pads 130. For example, the external terminals 150 may contact the bottom surfaces of the external pads 130. The substrate protection layer 140 may include a dielectric polymer or a photo-imagable dielectric (PID).

The external terminals 150 may include solder balls or solder bumps, and based on type and arrangement of the external terminals 150, a semiconductor package may be provided in the form of one of a ball grid array (BGA) type, a fine ball-grid array (FBGA) type, and a land grid array (LGA) type.

The first redistribution substrate 100 may be provided as discussed above. The present inventive concepts, however, are not limited thereto. The first redistribution substrate 100 may be a printed circuit board (PCB). For example, the first redistribution substrate 100 may have a core layer and peripheral parts for interconnection on top and bottom of the core layer.

A lower semiconductor chip 200 may be disposed on the first redistribution substrate 100. When viewed in a plan view, the lower semiconductor chip 200 may be disposed on a central area of the first redistribution substrate 100. The lower semiconductor chip 200 may be a logic chip. Alternatively, the lower semiconductor chip 200 may be a memory chip, such as dynamic random access memory (DRAM), static random access memory (SRAM), magnetic random access memory (MRAM), or Flash memory. The lower semiconductor chip 200 may have a front surface and a rear surface. Herein, the language "front surface" may be defined to indicate an active surface of an integrated element in a semiconductor chip or a surface on which are formed a plurality of pads of a semiconductor chip, and the language "rear surface" may be defined to indicate an opposite surface that faces the front surface.

The front surface of the lower semiconductor chip 200 may be directed toward the first redistribution substrate 100. For example, the lower semiconductor chip 200 may be disposed in a face-down state on the first redistribution substrate 100. The lower semiconductor chip 200 may include a first base layer 210, a first circuit layer 220 provided on a front surface of the first base layer 210, and one or more first through vias 240 that penetrate the first base layer 210.

The first base layer 210 may be formed of silicon (Si). An integrated element or integrated circuits may be formed in a lower portion of the first base layer 210.

The first circuit layer 220 may be provided on a bottom surface of the first base layer 210. The first circuit layer 220 may be electrically connected to the integrated element or the integrated circuits formed in the first base layer 210. For example, the first circuit layer 220 may have a circuit pattern 224 provided in a dielectric pattern 222, and the circuit pattern 224 may be coupled to the integrated element or integrated circuits formed in the first base layer 210. A portion of the circuit pattern 224 may be exposed on a bottom surface of the first circuit layer 220, and the exposed portion of the circuit pattern 224 may correspond to a pad of the lower semiconductor chip 200. The first circuit layer 220 may be provided on a bottom surface of the lower semiconductor chip 200, and the bottom surface of the lower semiconductor chip 200 may be an active surface of the lower semiconductor chip 200.

The first through via 240 may vertically penetrate the first base layer 210. The first through via 240 may have one end exposed on a top surface of the first base layer 210. The first through via 240 may be exposed on the top surface of the first base layer 210 or a rear surface of the lower semiconductor chip 200. The first through via 240 may have another end that extends toward a front surface of the lower semiconductor chip 200 to be coupled to the first circuit layer 220. The first through via 240 may be coupled to the circuit pattern 224 of the first circuit layer 220. The first through via 240 may be provided in plural.

Although not shown, a first passivation layer may be provided on the top surface of the first base layer 210. In this case, the first through vias 240 may penetrate the first passivation layer to be exposed on a top surface of the first passivation layer. The first passivation layer may include a dielectric material. For example, the first passivation layer may include silicon nitride (SiN), silicon oxide (SiO), or silicon oxynitride (SiON).

The lower semiconductor chip 200 may be provided with first chip connection terminals 202 on the bottom surface thereof. The first chip connection terminals 202 may be electrically connected to the first circuit layer 220. For example, the first chip connection terminals 202 may contact exposed portions of the circuit pattern 224. The first chip connection terminals 202 may be electrically connected to an input/output circuit (or a memory circuit), a power circuit, or a ground circuit of the lower semiconductor chip 200. The first chip connection terminals 202 may include, for example, solder balls as shown in FIG. 1. Alternatively, the first chip connection terminals 202 may include, for example, solder bumps as shown in FIG. 2. In this case, the solder bumps may include a metallic material, such as copper (Cu). The following description will focus on the embodiment of FIG. 1.

The lower semiconductor chip 200 may be mounted on the first redistribution substrate 100. For example, the first circuit layer 220 of the lower semiconductor chip 200 may be directed toward a top surface of the first redistribution substrate 100. The lower semiconductor chip 200 may be electrically connected through the first chip connection terminals 202 to the first redistribution substrate 100. The first chip connection terminals 202 may be provided between the first substrate pads 122 of the first redistribution substrate 100 and the first circuit layer 220 of the lower semiconductor chip 200. The first chip connection terminals 202 may be used to mount the lower semiconductor chip 200 onto the first redistribution substrate 100, and thus the bottom surface of the lower semiconductor chip 200 may be spaced apart from the first redistribution substrate 100. For example, the bottom surface of the lower semiconductor chip 200 may be spaced apart from the top surface of the first redistribution substrate 100.

Although not shown, an underfill layer may be provided between the first redistribution substrate 100 and the lower semiconductor chip 200. The underfill layer part may surround the first chip connection terminals 202, while filling a space between the first redistribution substrate 100 and the lower semiconductor chip 200.

A lower molding layer 410 may be provided on the first redistribution substrate 100. The lower molding layer 410 may cover the top surface of the first redistribution substrate 100. When viewed in a plan view, the lower molding layer 410 may surround the lower semiconductor chip 200. The lower molding layer 410 may cover lateral surfaces of the lower semiconductor chip 200 and expose the top surface of the lower semiconductor chip 200. For example, the lower molding layer 410 may contact the lateral surfaces of the lower semiconductor chip 200. A top surface of the lower molding layer 410 may be located at a higher level than that of the top surface of the lower semiconductor chip 200. In this description, the top surface of the lower semiconductor chip 200 may correspond to the top surface of the first base layer 210 of the lower semiconductor chip 200. The top surface of the lower semiconductor chip 200 may be closer to the first redistribution substrate 100 than the top surface of the lower molding layer 410. For example, the top surface of the lower semiconductor chip 200 may constitute a recess RS that is recessed toward the first redistribution substrate 100 from the top surface of the lower molding layer 410.

The recess RS may have a bottom surface that exposes the top surface of the lower semiconductor chip 200 and an inner sidewall that exposes the lower molding layer 410. The top surface of the lower molding layer 410 may be located at substantially the same as that of top surfaces of the first through vias 240 of the lower semiconductor chip 200. For example, the recess RS may be defined by the top surface of the lower molding layer 410 and the top surface of the first base layer 210, and the first through vias 240 may protrude onto the bottom surface of the recess RS.

FIG. 1 depicts that the top surface of the lower molding layer 410 is located at the same level as that of the top surfaces of the first through vias 240, but the present inventive concepts are not limited thereto. As shown in FIG. 3, the top surface of the lower molding layer 410 may be located at a higher level than that of the top surfaces of the first through vias 240. For example, the top surface of the lower molding layer 410 may be located at a higher level than that of an entirety of the lower semiconductor chip 200. In example embodiments, an uppermost top surface of the lower molding layer 410 may be located at a higher level than that of a top surface of the underfill layer 504 and that of the dielectric pattern 522 of the upper semiconductor chip 500. In example embodiments, the uppermost top surface of the lower molding layer 410 may be located at a higher level than a lower surface of the underfill layer 504 and at a lower level than a top surface of the underfill layer 504.

The following description will focus on the embodiment of FIG. 1. When no underfill layer is provided, the lower molding layer 410 may surround the first chip connection terminals 202, while filling a space between the first redistribution substrate 100 and the lower semiconductor chip 200. In example embodiments, the lower molding layer 410 may contact a bottom surface of the lower semiconductor chip 200, a top surface of the first redistribution substrate 100 below the lower semiconductor chip 200, and side surfaces of the first chip connection terminals 202. The lower molding layer 410 may include a dielectric material, such as an epoxy molding compound (EMC).

An intermediate passivation layer 420 may be disposed on the lower molding layer 410. The intermediate passivation layer 420 may conformally cover the lower molding layer 410 and the lower semiconductor chip 200. The intermediate passivation layer 420 may contact top surfaces of the lower molding layer 410 and the lower semiconductor chip 200. For example, the intermediate passivation layer 420 may conformally cover the top surface of the lower molding layer 410, and may also conformally cover the inner sidewall and the bottom surface of the recess RS. In the recess RS, the intermediate passivation layer 420 may cover lateral surfaces of the first through vias 240 that protrude onto the bottom surface of the recess RS, and may not cover the top surfaces of the first through vias 240. For example, the intermediate passivation layer 420 may contact the lateral surfaces of the first through vias 240. For example, on the top surface of the lower semiconductor chip 200, the first through vias 240 may vertically penetrate the intermediate passivation layer 420 to be exposed on a top surface of the intermediate passivation layer 420. The intermediate passivation layer 420 may include silicon oxide (SiO) or silicon nitride (SiN).

At least one lower post 300 may be provided on the first redistribution substrate 100. The lower post 300 may be disposed on a side of the lower semiconductor chip 200. In example embodiments, the lower posts 300 may be disposed on both sides of the lower semiconductor chip 200. The lower post 300 may vertically penetrate the lower molding layer 410. The lower post 300 may have one end that extends toward the first redistribution substrate 100 to be coupled to second substrate pads 124 of the first substrate wiring pattern 120 in the first redistribution substrate 100. The lower post 300 may have another end that extends toward the top surface of the lower molding layer 410. The lower post 300 may penetrate the intermediate passivation layer 420 to be exposed on the top surface of the intermediate passivation layer 420. A top surface of the lower post 300 may be coplanar with that of the intermediate passivation layer 420. The lower post 300 may have a width that is constant irrespective of distance from the first redistribution substrate 100. Alternatively, the width of the lower post 300 may decease with increasing distance from the first redistribution substrate 100. The lower post 300 may include copper (Cu).

The lower post 300 may have a post pad 310 on an upper portion thereof. The post pad 310 may be positioned on an uppermost end of the lower post 300. The post pad 310 may be exposed on the top surface of the intermediate passivation layer 420. The post pad 310 may have a thickness greater than that of the intermediate passivation layer 420. For example, the post pad 310 may vertically penetrate the intermediate passivation layer 420, and a portion of the post pad 310 may extend into the lower molding layer 410. A remainder of the lower post 300 except the post pad 310 may be buried in the lower molding layer 410. The present inventive concepts, however, are not limited thereto. The thickness of the post pad 310 may be the same as that of the intermediate passivation layer 420, and in this case, a bottom surface of the post pad 310 may be located at the same level as that of an interface between the intermediate passivation layer 420 and the lower molding layer 410. The post pad 310 may include a metallic material, such as nickel (Ni), palladium (Pd), or titanium (Ti).

An upper semiconductor chip 500 may be disposed on the intermediate passivation layer 420. The upper semiconductor chip 500 may be positioned over the lower semiconductor chip 200. When viewed in a plan view, an entirety of the upper semiconductor chip 500 may overlap the lower semiconductor chip 200. For example, the upper semiconductor chip 500 may vertically overlap the lower semiconductor chip 200. The upper semiconductor chip 500 may have a width in the horizontal direction that is less than that of the lower semiconductor chip 200. For example, when viewed in a plan view, the upper semiconductor chip 500 may be positioned in the recess RS. In some example embodiments, when viewed in a plan view, the upper semiconductor chip 500 may be centered in the recess RS. In some example embodiments, when viewed in a plan view, the upper semiconductor chip 500 may overlap the recess RS. In some example embodiments, when viewed in a plan view, the upper semiconductor chip 500 may be provided within a boundary formed by sidewalls of the recess RS. The upper semiconductor chip 500 may have a thickness greater than that of the lower semiconductor chip 200. The upper semiconductor chip 500 may be a logic chip. Alternatively, the upper semiconductor chip 500 may be a memory chip, such as dynamic random access memory (DRAM), static random access memory (SRAM), magnetic random access memory (MRAM), or Flash memory. The upper semiconductor chip 500 may have a front surface and a rear surface. The front surface of the upper semiconductor chip 500 may be directed toward the first redistribution substrate 100. For example, the upper semiconductor chip 500 may be disposed in a face-down state on the intermediate passivation layer 420. The upper semiconductor chip 500 may include a second base layer 510 and a second circuit layer 520 provided on a front surface of the second base layer 510.

The second base layer 510 may be formed of silicon (Si). An integrated element or integrated circuits may be formed in a lower portion of the second base layer 510.

The second circuit layer 520 may be provided on a bottom surface of the second base layer 510. The second circuit layer 520 may be electrically connected to the integrated element or the integrated circuits formed in the second base layer 510. For example, the second circuit layer 520 may have a circuit pattern 524 provided in a dielectric pattern 522, and the circuit pattern 524 may be coupled to the integrated element or integrated circuits formed in the second base layer 510. A portion of the circuit pattern 524 may be exposed on a bottom surface of the second circuit layer 520, and the exposed portion of the circuit pattern 524 may correspond to a pad of the upper semiconductor chip 500. The upper semiconductor chip 500 may be provided with the second circuit layer 520 on a bottom surface thereof, and the bottom surface of the upper semiconductor chip 500 may be an active surface of the upper semiconductor chip 500.

The upper semiconductor chip 500 may be provided thereon with second chip connection terminals 502 on the bottom surface thereof. The second chip connection terminals 502 may be electrically connected to the second circuit layer 520. For example, the second chip connection terminals 502 may contact exposed portions of the circuit pattern 524. The second chip connection terminals 502 may be electrically connected to an input/output circuit (or a memory circuit), a power circuit, or a ground circuit of the upper semiconductor chip 500. The second chip connection terminals 502 may include, for example, solder balls as shown in FIGS. 1, 2, and 3. Alternatively, although not illustrated, the second chip connection terminals 502 may include solder bumps. In this case, the solder bumps may include a metallic material, such as copper (Cu). The following description will focus on the embodiment of FIG. 1.

The upper semiconductor chip 500 may be mounted on the lower semiconductor chip 200. For example, the second circuit layer 520 of the upper semiconductor chip 500 may be directed toward the top surface of the intermediate passivation layer 420. The upper semiconductor chip 500 may be electrically connected through the second chip connection terminals 502 to the lower semiconductor chip 200. The second chip connection terminals 502 may be provided between the second circuit layer 520 of the upper semiconductor chip 500 and the first through vias 240 exposed onto the intermediate passivation layer 420. The upper semiconductor chip 500 may be mounted on the lower semiconductor chip 200 through the second chip connection terminals 502 and the first through vias 240. The bottom surface of the upper semiconductor chip 500 may be spaced apart from the intermediate passivation layer 420. For example, the bottom surface of the upper semiconductor chip 500 may be spaced apart from the top surface of the intermediate passivation layer 420.

An underfill layer 504 may be provided between the upper semiconductor chip 500 and the intermediate passivation layer 420. The underfill layer 504 may surround the second chip connection terminals 502, while filling a space between the upper semiconductor chip 500 and the bottom surface of the recess RS. The underfill layer 504 may contact the second chip connection terminals 502, a bottom surface of the upper semiconductor chip 500, and an upper surface of the intermediate passivation layer 420.

An upper molding layer 430 may be provided on the intermediate passivation layer 420. The upper molding layer 430 may cover the top surface of the intermediate passivation layer 420. For example, the intermediate passivation layer 420 may extend from the top surface of the lower semiconductor chip 200, or the bottom surface of the recess RS, through the inner sidewall of the recess RS into a space between the lower molding layer 410 and the upper molding layer 430. In example embodiments, the upper molding layer 430 may contact the top surface of the intermediate passivation layer 420 and side surfaces of the underfill layer 504. When viewed in a plan view, the upper molding layer 430 may surround the upper semiconductor chip 500. The upper molding layer 430 may cover lateral surfaces of the upper semiconductor chip 500 and expose the top surface of the upper semiconductor chip 500. A top surface of the upper molding layer 430 may be coplanar with that of the upper semiconductor chip 500. The upper molding layer 430 may directly contact the lateral surfaces of the upper semiconductor chip 500. According to some embodiments, the upper molding layer 430 may cover the top surface of the upper semiconductor chip 500. On a side of the lower semiconductor chip 200, the upper molding layer 430 may have a thickness substantially the same as that of the lower molding layer 410. The present inventive concepts, however, are not limited thereto, and the upper molding layer 430 and the lower molding layer 410 may have different thicknesses from each other. The upper molding layer 430 may be formed of a dielectric material, such as an epoxy molding compound (EMC).

At least one upper post 350 may be provided on the intermediate passivation layer 420. The upper post 350 may be disposed on a side of the upper semiconductor chip 500. In example embodiments, the upper posts 350 may be disposed on both sides of the upper semiconductor chip 500. The upper post 350 may vertically penetrate the upper molding layer 430. The upper post 350 may have one end that extends toward the intermediate passivation layer 420 to be coupled to the post pad 310 of the lower post 300. For example, the intermediate passivation layer 420 may extend from the bottom surface of the recess RS through the inner sidewall of the recess RS into a space between the lower molding layer 410 and the upper molding layer 430, and the post pad 310 of the lower post 300 may penetrate the intermediate passivation layer 420 to come into contact with the upper post 350. The upper post 350 may have another end that extends toward the top surface of the upper molding layer 430. The upper post 350 may be exposed on the top surface of the upper molding layer 430. A top surface of the upper post 350 may be coplanar with that of the upper molding layer 430. The upper post 350 may have a thickness substantially the same as that of the lower post 300. In this description, a thickness of a post may correspond to a length of the post in a direction perpendicular to the top surface of the first redistribution substrate 100. The present inventive concepts, however, are not limited thereto, and the upper post 350 and the lower post 300 may have different thicknesses from each other. The upper post 350 may have a width that is constant irrespective of distance from the intermediate passivation layer 420. Alternatively, the width of the upper post 350 may decrease with increasing distance from the intermediate passivation layer 420. The upper post 350 may include a different material from that of the lower post 300. For example, the upper post 350 may include titanium (Ti). The present inventive concepts, however, are not limited thereto, and the upper post 350 may include the same material as that of the lower post 300. For example, the upper post 350 may include copper (Cu).

A second redistribution substrate 600 may be provided on the upper molding layer 430 and the upper semiconductor chip 500. The second redistribution substrate 600 may directly contact the top surface of the upper molding layer 430 and the top surface of the upper semiconductor chip 500.

The second redistribution substrate 600 may include one or more second substrate wiring layers that are stacked on each other. Each of the second substrate wiring layers may include a second substrate dielectric pattern 610 and a second substrate wiring pattern 620 in the second substrate dielectric pattern 610. When the second substrate wiring layer is provided in plural, the second substrate wiring pattern 620 in one second substrate wiring layer may be electrically connected to the second substrate wiring pattern 620 in an adjacent another second substrate wiring layer.

The second substrate dielectric pattern 610 may include a dielectric polymer or a photo-imagable dielectric (PID). For example, the photo-imagable dielectric may include at least one selected from photosensitive polyimide (PI), polybenzoxazole (PBO), phenolic polymers, and benzocyclobutene polymers. Alternatively, the second substrate dielectric pattern 610 may include a dielectric material. For example, the second substrate dielectric pattern 610 may include silicon oxide (SiO), silicon nitride (SiN), silicon oxynitride (SiON), or dielectric polymers.

The second substrate wiring pattern 620 may be provided on the second substrate dielectric pattern 610. The second substrate wiring pattern 620 may horizontally extend on the second substrate dielectric pattern 610. The second substrate wiring pattern 620 may be provided on a top surface of the second substrate dielectric pattern 610. The second substrate wiring patterns 620 may protrude onto the top surface of the second substrate dielectric pattern 610. On the second substrate dielectric pattern 610, the second substrate wiring pattern 620 may be covered with another second substrate dielectric pattern 610 disposed on the second substrate dielectric pattern 610. The second substrate wiring pattern 620 provided in an uppermost second substrate wiring layer may be redistribution pads on which is mounted an external device or an electronic apparatus. The second substrate wiring pattern 620 may be a pad or line part of the second substrate wiring layer. For example, the second substrate wiring pattern 620 may be a component for horizontal redistribution in the second substrate wiring layer. As shown in FIG. 1, the second substrate wiring pattern 620 may connect the redistribution pad to the upper post 350. For example, the upper post 350 and the lower post 300 may correspond to a vertical connector that electrically connects the first redistribution substrate 100 to the second redistribution substrate 600. FIG. 1 depicts by way of example an electrical connection of the second substrate wiring pattern 620, and a shape and arrangement of the second substrate wiring pattern 620 is not limited to that illustrated in FIG. 1. The second substrate wiring pattern 620 may include a conductive material. For example, the second substrate wiring pattern 620 may include copper (Cu).

The second substrate wiring pattern 620 may have a damascene structure. For example, the second substrate wiring pattern 620 may have a head part and a tail part that are connected into a single unitary piece. The head and tail parts of the second substrate wiring pattern 620 may have a T shape when viewed in a vertical section view.

The head part of the second substrate wiring pattern 620 may be a line or pad part for horizontal expansion of a wiring line in the second redistribution substrate 600. The head part may be provided on the top surface of the second substrate dielectric pattern 610. For example, the head part may protrude onto the top surface of the second substrate dielectric pattern 610, contacting the top surface of the second substrate dielectric pattern 610.

The tail part of the second substrate wiring pattern 620 may be a via part for vertical connection of a wiring line in the second redistribution substrate 600. The tail part may be coupled to another second substrate wiring layer disposed thereunder. For example, the tail part of the second substrate wiring pattern 620 may extend from a bottom surface of the head part, and may penetrate the second substrate dielectric pattern 610 to contact the head part of the second substrate wiring pattern 620 of an underlying another second substrate wiring layer. The tail part of the second substrate wiring pattern 620 disposed in a lowermost one of the second substrate wiring layers may penetrate the second substrate dielectric pattern 610 to be exposed on a bottom surface of the second redistribution substrate 600. The tail part of the second substrate wiring pattern 620 disposed in the lowermost second substrate wiring layer may be positioned on the upper molding layer 430. The tail part of the second substrate wiring pattern 620 disposed in the lowermost second substrate wiring layer may be coupled to the upper post 350. For example, the tail part of the second substrate wiring pattern 620 disposed in the lowermost second substrate wiring layer may contact a top surface of the upper post 350.

According to some embodiments of the present inventive concepts, because the upper semiconductor chip 500 has a relatively large thickness, heat generated from the lower and upper semiconductor chips 200 and 500 may be easily discharged not through the lower and upper molding layers 410 and 430 but through the upper semiconductor chip 500. In addition, as the upper semiconductor chip 500 is formed of silicon (Si) having high thermal conductivity, a semiconductor package may increase in thermal radiation efficiency.

Moreover, a vertical connector may be provided to vertically connect the first redistribution substrate 100 to the second redistribution substrate 600, and the lower post 300 and the upper post 350 may be used to cause the vertical connector to have a multi-layered structure. Therefore, even when the upper semiconductor chip 500 has a relatively large thickness, the vertical connector may be easily formed to have a high aspect ratio. Accordingly, the upper semiconductor chip 500 may be easily formed to have a large thickness, and a semiconductor package may increase in thermal radiation efficiency.

Furthermore, because heat is easily discharged from the lower semiconductor chip 200 and the upper semiconductor chip 500, a heat-induced intermetallic compound may be prevented from being formed in the first chip connection terminals 202 between the lower semiconductor chip 200 and the upper semiconductor chip 500. As a result, it may be possible to provide a semiconductor package with increased structural stability and improved operating stability.

In the embodiments that follow, components the same as those discussed with reference to FIGS. 1 to 3 are allocated the same reference numerals thereto, and a repetitive explanation thereof will be omitted or abridged for convenience of description. The following description will focus on differences between the embodiments of FIGS. 1 to 3 and other embodiments described below.

Figure 4:
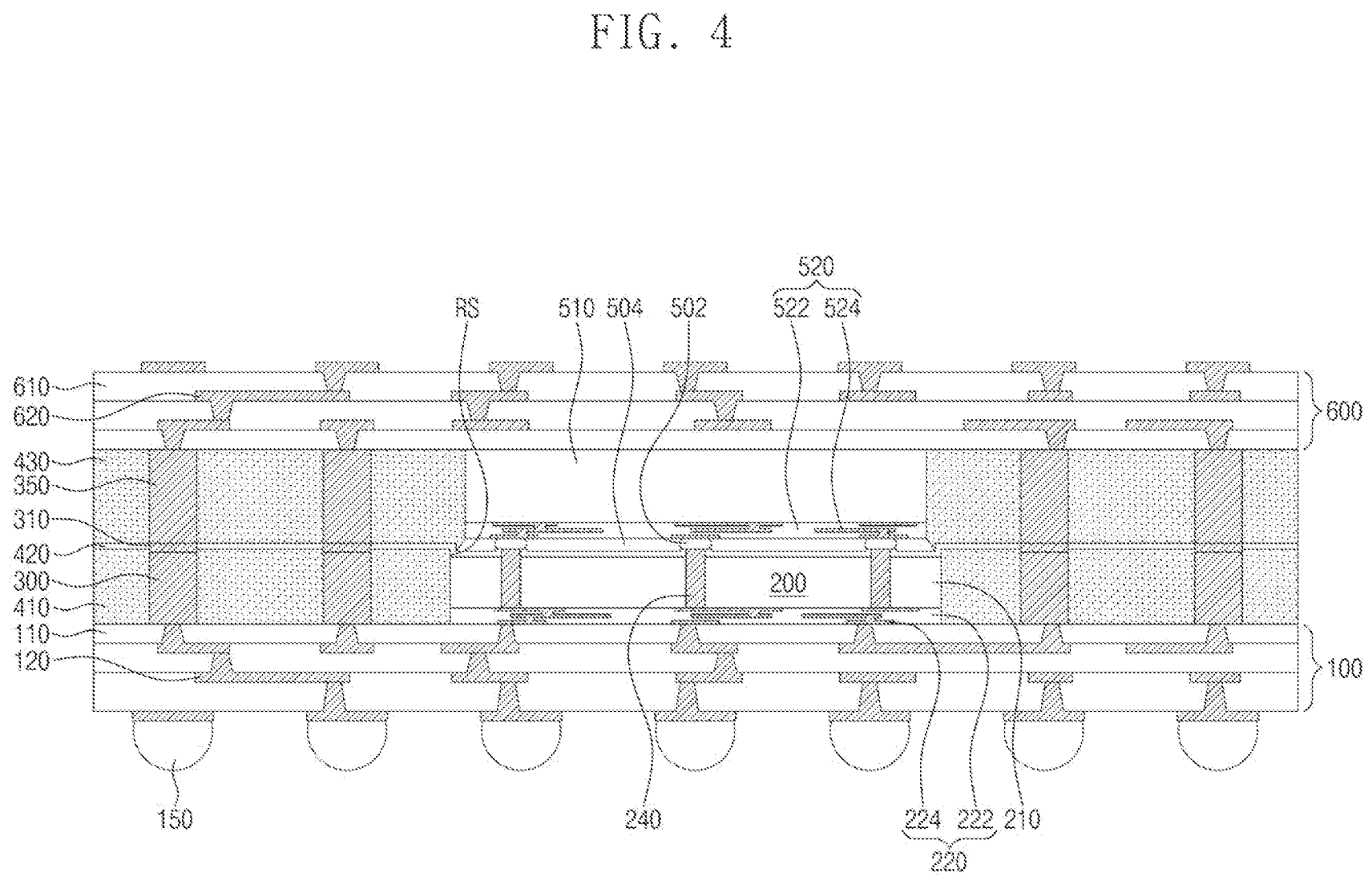

FIG. 4 illustrates a cross-sectional view showing a semiconductor package according to example embodiments of the present inventive concepts.

FIGS. 1 to 3 depict that the first chip connection terminals 202 are used to mount the lower semiconductor chip 200 onto the first redistribution substrate 100, but the present inventive concepts are not limited thereto.

Referring to FIG. 4, the first redistribution substrate 100 may include one or more first substrate wiring layers that are stacked on each other. Each of the first substrate wiring layers may include a first substrate dielectric pattern 110 and a first substrate wiring pattern 120 in the first substrate dielectric pattern 110.

The first substrate wiring pattern 120 may be provided below the first substrate dielectric pattern 110. The first substrate wiring pattern 120 may horizontally extend below the first substrate dielectric pattern 110. The first substrate wiring pattern 120 may be disposed on a bottom surface of the first substrate dielectric pattern 110. The first substrate wiring pattern 120 may protrude onto the bottom surface of the first substrate dielectric pattern 110. Below the first substrate dielectric pattern 110, the first substrate wiring pattern 120 may be covered with another first substrate dielectric pattern 110 that underlies the first substrate wiring pattern 120. The first substrate wiring pattern 120 provided in a lowermost first substrate wiring layer may serve as the external pads 130. For example, the external terminals 150 may be coupled to the first substrate wiring pattern 120 provided in the lowermost first substrate wiring layer.

The first substrate wiring pattern 120 may have a damascene structure. For example, the first substrate wiring pattern 120 may have a via that protrudes onto a top surface thereof. The via may be a component for vertically connecting to each other the first substrate wiring patterns 120 of neighboring first substrate wiring layers. Alternatively, the via may be a component for connecting the first substrate wiring pattern 120 of an uppermost first substrate wiring layer to the lower semiconductor chip 200 and the lower post 300 which will be discussed below. For example, the via may penetrate from the top surface of the first substrate wiring pattern 120 through the first substrate dielectric pattern 110 to contact a bottom surface of the first substrate wiring pattern 120 of another first substrate wiring layer that overlies the via. For another example, the via may penetrate from the top surface of the first substrate wiring pattern 120 through an uppermost first substrate dielectric pattern 110 to be exposed on a top surface of the first redistribution substrate 100. In this configuration, an upper portion of the first substrate wiring pattern 120 positioned on the first substrate dielectric pattern 110 may be a head part used as a horizontal line or pad, and the via of the first substrate wiring pattern 120 may be a tail part. The first substrate wiring pattern 120 may have a T shape.

The lower semiconductor chip 200 and at least one lower post 300 may be disposed on the first redistribution substrate 100. The lower semiconductor chip 200 and the lower post 300 may directly contact the first redistribution substrate 100. For example, a bottom surface of the first circuit layer 220 in the lower semiconductor chip 200 and a bottom surface of the lower post 300 may contact the top surface of the first redistribution substrate 100. The lower post 300 and a chip pad of the lower semiconductor chip 200 may contact the first substrate wiring pattern 120 exposed on the top surface of the first redistribution substrate 100. For example, the via of an uppermost first substrate wiring pattern 120 in the first redistribution substrate 100 may penetrate an uppermost first substrate dielectric pattern 110 to be coupled to the bottom surface of the lower post 300 and a bottom surface of the chip pad included in the lower semiconductor chip 200.

Figure 5:
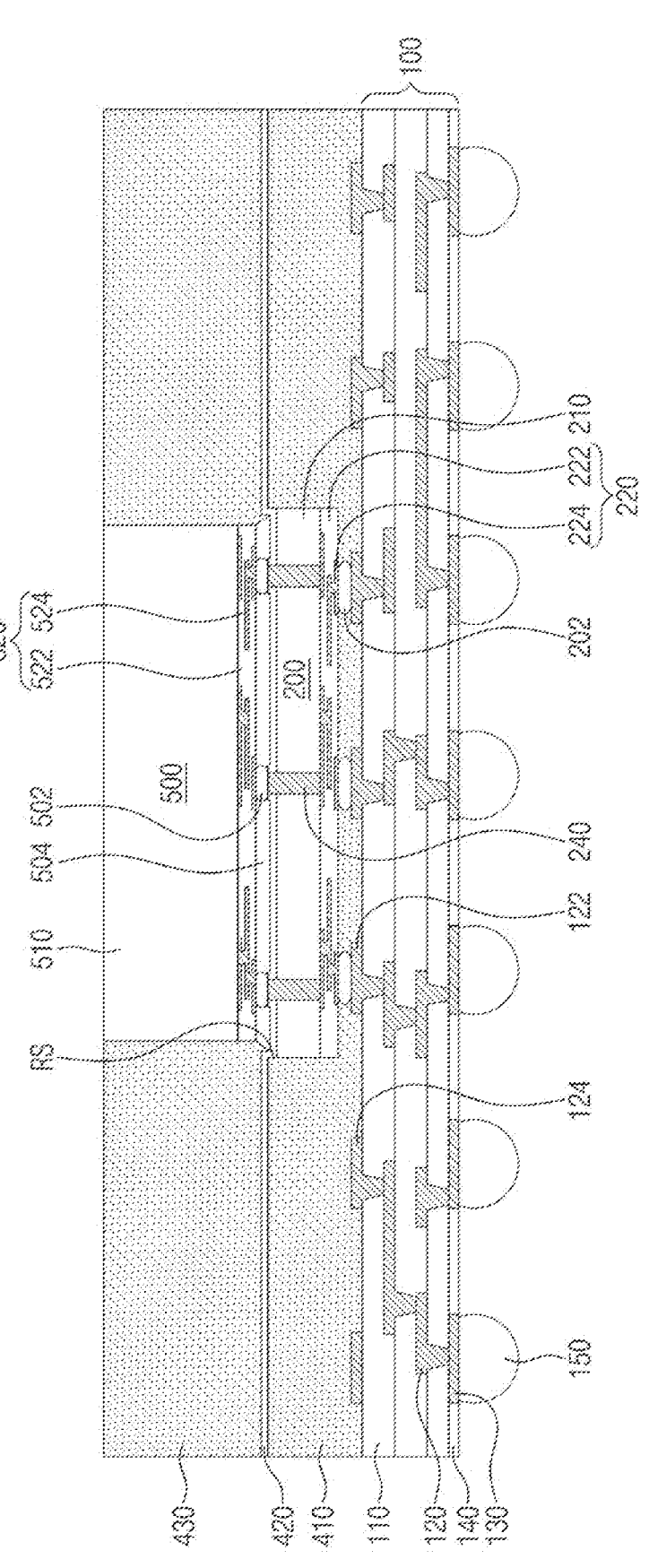

FIG. 5 illustrates a cross-sectional view showing a semiconductor package according to example embodiments of the present inventive concepts.

Referring to FIG. 5, any of a lower conductive post, an upper conductive post, and a second redistribution substrate may not be included.

As shown in FIG. 5, the lower semiconductor chip 200 may be mounted on the first redistribution substrate 100.

The lower molding layer 410 may be provided on the first redistribution substrate 100. The lower molding layer 410 may cover a top surface of the first redistribution substrate 100. When viewed in a plan view, the lower molding layer 410 may surround the lower semiconductor chip 200. The lower molding layer 410 may cover lateral surfaces of the lower semiconductor chip 200 and expose a top surface of the lower semiconductor chip 200. For example, the lower molding layer 410 may contact a bottom surface and lateral surfaces of the lower semiconductor chip 200. A top surface of the lower molding layer 410 may be located at a higher level than that of the top surface of the lower semiconductor chip 200. The top surface of the lower semiconductor chip 200 may constitute the recess RS that is recessed toward the first redistribution substrate 100 from the top surface of the lower molding layer 410.

The intermediate passivation layer 420 may be disposed on the lower molding layer 410. The intermediate passivation layer 420 may conformally cover the lower molding layer 410 and the lower semiconductor chip 200. For example, the intermediate passivation layer 420 may conformally cover the top surface of the lower molding layer 410, and may also conformally cover an inner sidewall and a bottom surface of the recess RS. For example, the intermediate passivation layer 420 may contact the top surface of the lower molding layer 410, an inner sidewall of the recess RS, and a top surface of the lower semiconductor chip 200. On the top surface of the lower semiconductor chip 200, the first through vias 240 may vertically penetrate the intermediate passivation layer 420 to be exposed on a top surface of the intermediate passivation layer 420.

The upper semiconductor chip 500 may be mounted on the lower semiconductor chip 200.

The upper molding layer 430 may be provided on the intermediate passivation layer 420. The upper molding layer 430 may cover the top surface of the intermediate passivation layer 420. When viewed in a plan view, the upper molding layer 430 may surround the upper semiconductor chip 500. The upper molding layer 430 may cover lateral surfaces of the upper semiconductor chip 500 and expose a top surface of the upper semiconductor chip 500. For example, the upper molding layer 430 may contact the top surface of the intermediate passivation layer 420, lateral surfaces of the upper semiconductor chip 500, and side surfaces of the underfill layer 504 between the intermediate passivation layer 420 and the upper semiconductor chip 500.

Although not illustrated in FIG. 5, the second redistribution substrate 600 may be disposed on the upper molding layer 430.

Figure 6:
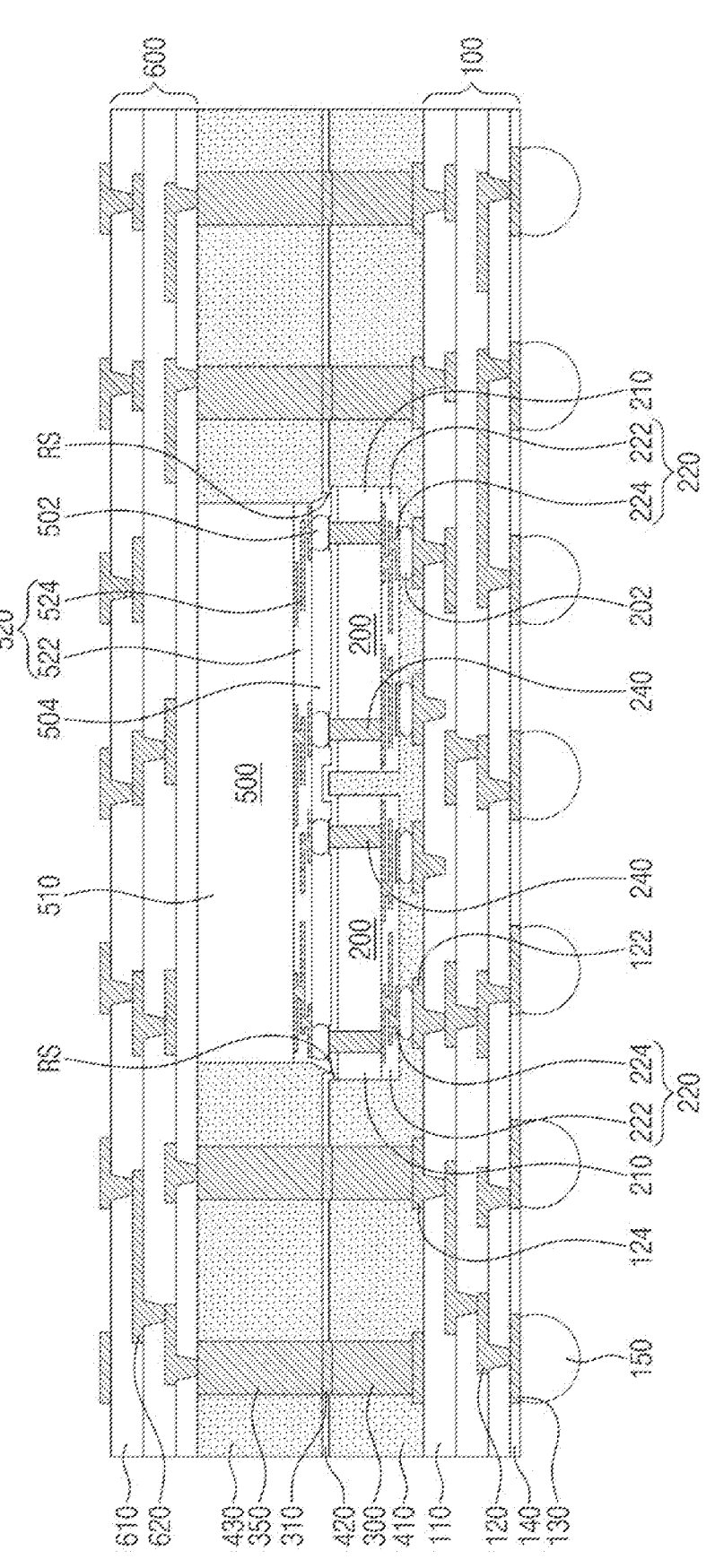

FIG. 6 illustrates a cross-sectional view showing a semiconductor package according to example embodiments of the present inventive concepts.

Referring to FIG. 6, the lower semiconductor chip 200 may be provided in plural. The lower semiconductor chips 200 may be disposed horizontally spaced apart from each other on the first redistribution substrate 100. The lower semiconductor chips 200 may be mounted on the first redistribution substrate 100 through the first chip connection terminals 202 provided on bottom surfaces of the lower semiconductor chips 200.

The lower molding layer 410 may be provided on the first redistribution substrate 100. The lower molding layer 410 may cover a top surface of the first redistribution substrate 100. When viewed in a plan view, the lower molding layer 410 may surround the lower semiconductor chips 200. The lower molding layer 410 may fill a space between the lower semiconductor chips 200. The lower molding layer 410 may cover lateral surfaces of the lower semiconductor chips 200 and expose top surfaces of the lower semiconductor chips 200. A top surface of the lower molding layer 410 may be located at a higher level than that of the top surfaces of the lower semiconductor chips 200. Each of the lower semiconductor chips 200 may be provided thereon with the recess RS that is recessed from the lower molding layer 410.

The intermediate passivation layer 420 may be disposed on the lower molding layer 410. The intermediate passivation layer 420 may conformally cover the lower molding layer 410 and the lower semiconductor chips 200. For example, the intermediate passivation layer 420 may contact the lower molding layer 410 and top surfaces of the lower semiconductor chips 200. On the top surface of the lower semiconductor chip 200, the first through vias 240 may vertically penetrate the intermediate passivation layer 420 to be exposed on the top surface of the intermediate passivation layer 420.

The upper semiconductor chip 500 may be mounted on the lower semiconductor chips 200. For example, the second circuit layer 520 of the upper semiconductor chip 500 may be directed toward the top surface of the intermediate passivation layer 420. The upper semiconductor chip 500 may overlap at least a portion of each of the lower semiconductor chips 200. For example, the upper semiconductor chip 500 may vertically overlap the lower semiconductor chips 200. The upper semiconductor chip 500 may be electrically connected through the second chip connection terminals 502 to the lower semiconductor chips 200. The second chip connection terminals 502 may be aligned with the first through vias 240 of one of the lower semiconductor chips 200. The upper semiconductor chip 500 may be mounted on the lower semiconductor chips 200 through the second chip connection terminals 502 and the first though vias 240. Neither a portion of the lower molding layer 410 positioned on the lower semiconductor chips 200 nor its overlying intermediate passivation layer 420 may contact the upper semiconductor chip 500.

The upper molding layer 430 may be provided on the intermediate passivation layer 420. The upper molding layer 430 may cover the top surface of the intermediate passivation layer 420. When viewed in a plan view, the upper molding layer 430 may surround the upper semiconductor chip 500. The upper molding layer 430 may cover lateral surfaces of the upper semiconductor chip 500 and expose a top surface of the upper semiconductor chip 500. For example, the upper molding layer 430 may contact the top surface of the intermediate passivation layer 420, lateral surfaces of the upper semiconductor chip 500, and side surfaces of the underfill layer 504 between the intermediate passivation layer 420 and the upper semiconductor chip 500.

The second redistribution substrate 600 may be disposed on the upper molding layer 430.

Figure 7:
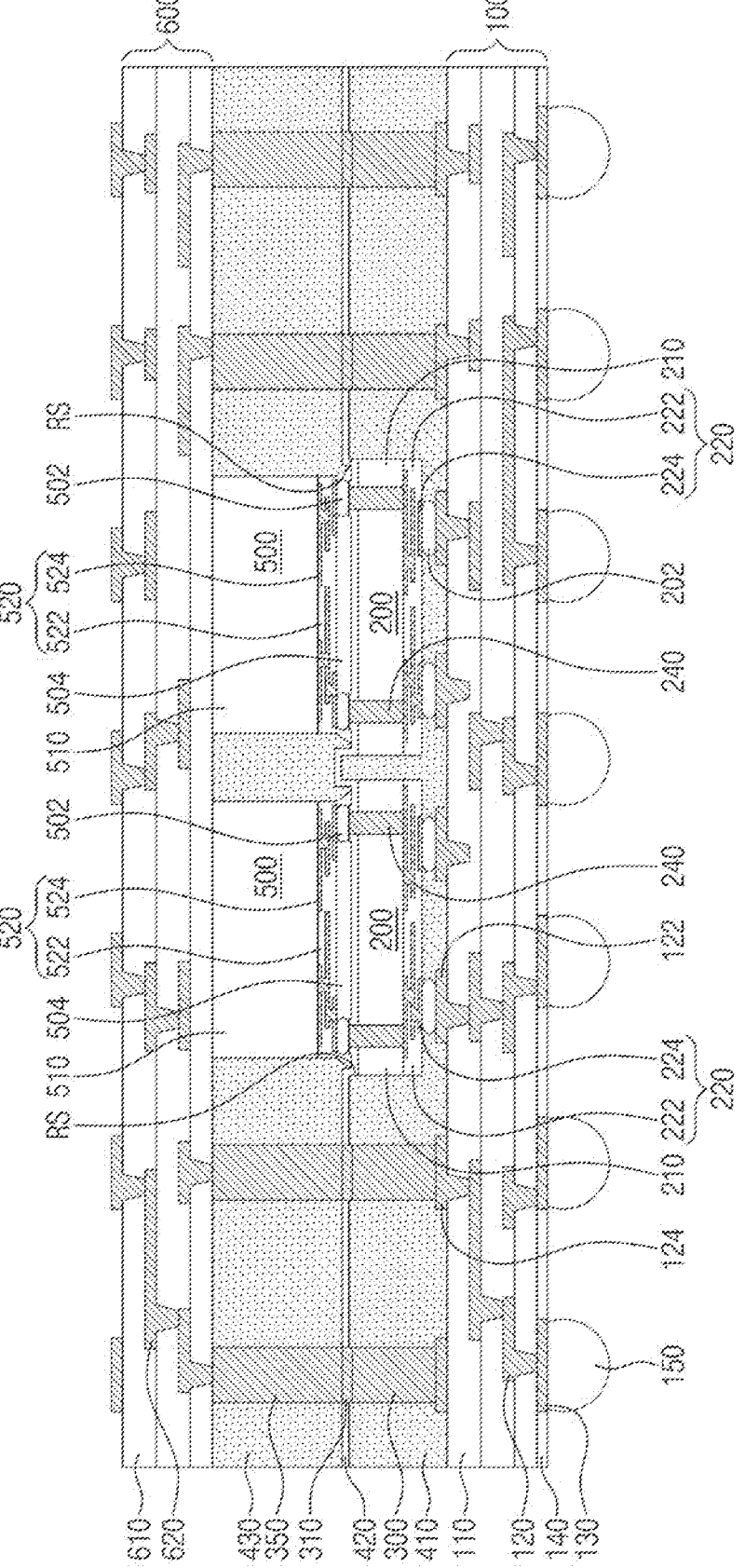

FIG. 7 illustrates a cross-sectional view showing a semiconductor package according to example embodiments of the present inventive concepts.

Referring to FIG. 7, the upper semiconductor chip 500 may be provided in plural, compared to the embodiment of FIG. 6. Each of the upper semiconductor chips 500 may be positioned on one of the lower semiconductor chips 200. When viewed in a plan view, each of the upper semiconductor chips 500 may be positioned in one of the recesses RS.

The upper semiconductor chips 500 may be mounted on the lower semiconductor chips 200. For example, the second circuit layers 520 of the upper semiconductor chips 500 may be directed toward a top surface of the intermediate passivation layer 420. Each of the upper semiconductor chips 500 may be electrically connected through the second chip connection terminals 502 to a corresponding one of the lower semiconductor chips 200. The second chip connection terminals 502 may be provided between the second circuit layer 520 of the upper semiconductor chip 500 and the first through vias 240 exposed on the intermediate passivation layer 420. The upper semiconductor chip 500 may be mounted on the lower semiconductor chip 200 through the second chip connection terminals 502 and the first through vias 240.

The upper molding layer 430 may be provided on the intermediate passivation layer 420. The upper molding layer 430 may cover the top surface of the intermediate passivation layer 420. When viewed in a plan view, the upper molding layer 430 may surround each of the upper semiconductor chips 500. The upper molding layer 430 may cover lateral surfaces of the upper semiconductor chips 500 and expose top surfaces of the upper semiconductor chips 500. For example, the upper molding layer 430 may contact the top surface of the intermediate passivation layer 420, lateral surfaces of the upper semiconductor chips 500, and side surfaces of the underfill layer 504 between the intermediate passivation layer 420 and the upper semiconductor chips 500.

The second redistribution substrate 600 may be disposed on the upper molding layer 430.

FIGS. 8 to 16 illustrate cross-sectional views showing a method of fabricating a semiconductor package according to example embodiments of the present inventive concepts.

Figure 8:
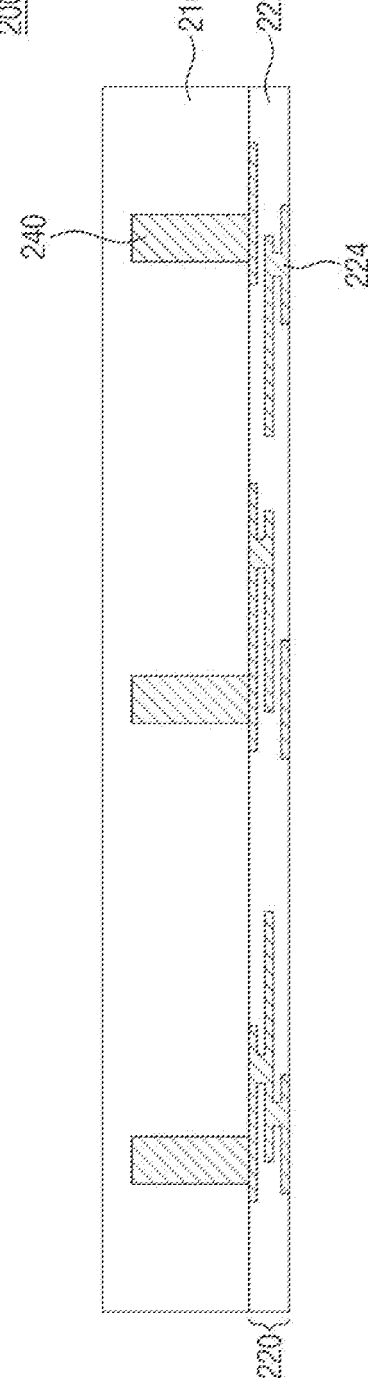

Referring to FIG. 8, a typical process may be performed to form a lower semiconductor chip 200 on a semiconductor substrate. For example, integrated circuits such as transistors may be formed on an active surface of the semiconductor substrate. The semiconductor substrate may correspond to a first base layer 210 of the lower semiconductor chip 200. Through holes may be formed to penetrate the semiconductor substrate, and then the through holes may be filled with a conductive material to form first through vias 240. The first through vias 240 may not completely penetrate the semiconductor substrate. For example, the first through vias 240 may not be exposed on an inactive surface of the semiconductor substrate. A first circuit layer 220 may be formed by forming a dielectric pattern 222 and a circuit pattern 224 on the active surface of the semiconductor substrate. The circuit pattern 224 may be electrically connected to the integrated circuits and the first through vias 240. After the formation of the through holes that penetrate the semiconductor substrate, the through holes may be filled with a conductive material to form the first through vias 240.

Figure 9:
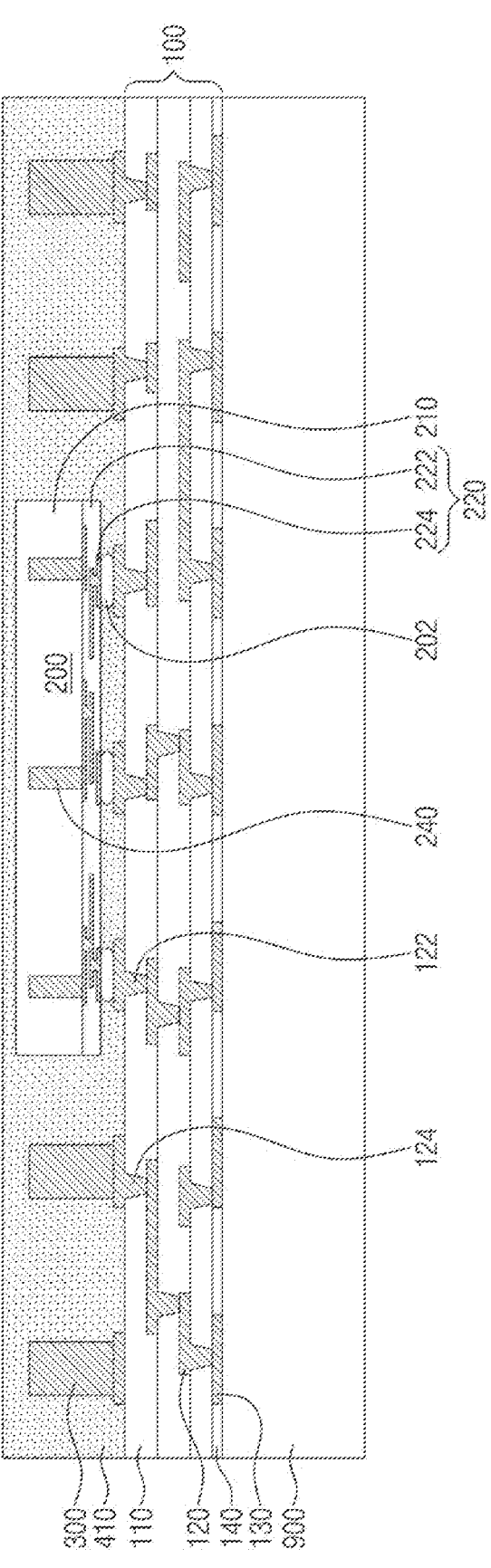

Referring to FIG. 9, a carrier substrate 900 may be provided. The carrier substrate 900 may be a dielectric substrate including glass or polymer, or may be a conductive substrate including metal. Although not shown, an adhesive member may be provided on a top surface of the carrier substrate 900. For example, the adhesive member may include a glue tape.

A first redistribution substrate 100 may be formed on the carrier substrate 900. For example, a photo-imagable dielectric layer may be deposited on the carrier substrate 900 to form a substrate protection layer 140. An exposure process may be performed on the substrate protection layer 140, and then the substrate protection layer 140 may be patterned to form through holes. The through holes of the substrate protection layer 140 may be filled with a conductive material to form external pads 130. A dielectric material may be deposited to form a dielectric layer on the substrate protection layer 140, the dielectric layer may be patterned to expose the external pads 130 and to form a first substrate dielectric pattern 110, a conductive layer may be formed on the first substrate dielectric pattern 110, and the conductive layer may be patterned to form a first substrate wiring pattern 120. As such, a single first substrate wiring layer may be formed. The formation of the first substrate wiring layer may be repeatedly performed to form the first redistribution substrate 100. Portions of the first substrate wiring pattern 120 provided in an uppermost first substrate wiring layer may be first substrate pads 122 and second substrate pads 124.

A lower semiconductor chip 200 may be mounted on the first redistribution substrate 100. The lower semiconductor chip 200 may be mounted in a flip-chip manner. For example, first chip connection terminals 202 may be provided on chip pads of the lower semiconductor chip 200, and the lower semiconductor chip 200 may be placed on the first redistribution substrate 100 to allow the first chip connection terminals 202 to rest on the first substrate pads 122 of the first redistribution substrate 100. Afterwards, the first chip connection terminals 202 may undergo a reflow process to mount the lower semiconductor chip 200 on the first redistribution substrate 100.

One or more lower posts 300 may be formed on the first redistribution substrate 100. For example, a sacrificial layer may be formed on the first redistribution substrate 100, the sacrificial layer may be etched to form through holes that expose the second substrate pads of the first redistribution substrate 100, and then the through holes may be filled with a conductive material to form the lower posts 300. After that, the sacrificial layer may be removed.

A lower molding layer 410 may be formed on the first redistribution substrate 100. For example, the lower molding layer 410 may be formed by depositing on the first redistribution substrate 100 a dielectric material that covers the lower semiconductor chip 200 and the lower posts 300.

Figure 10:
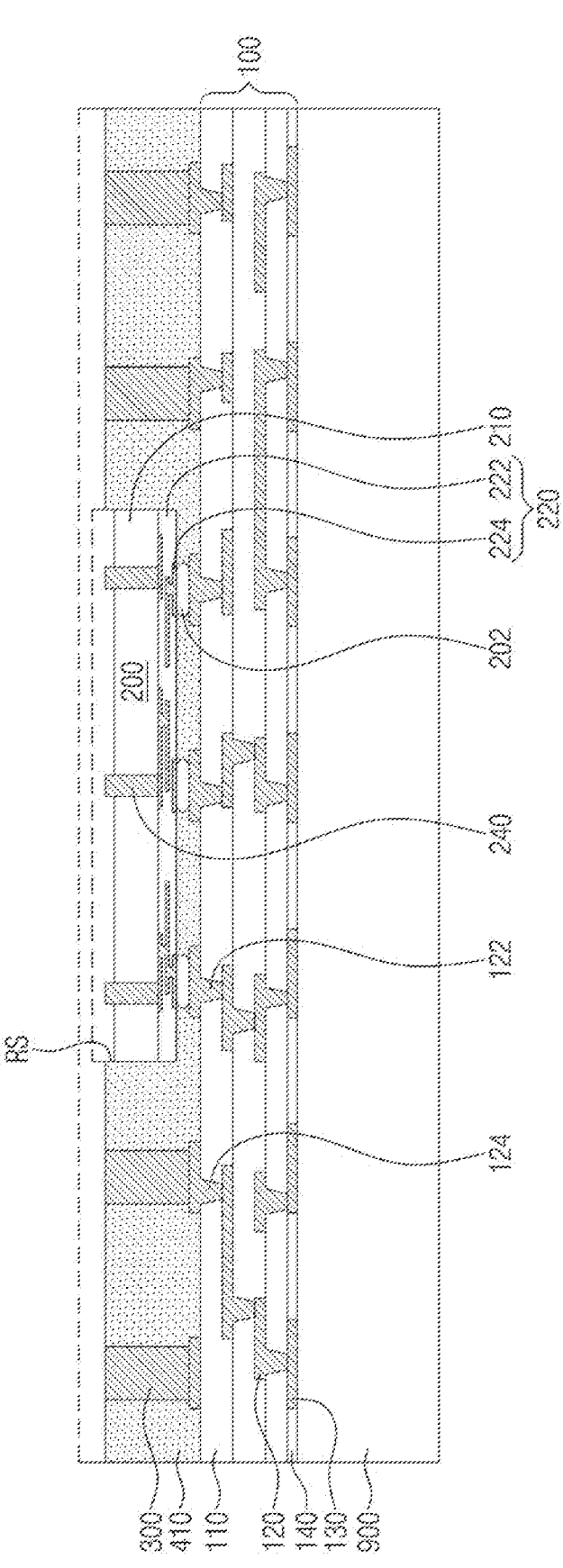

Referring to FIG. 10, a portion of the lower molding layer 410 may be removed. For example, a grinding process or a chemical mechanical polishing (CMP) process may be performed on a top surface of the lower molding layer 410. The grinding process or the chemical mechanical polishing process may continue until a top surface of the lower semiconductor chip 200 is exposed and top surfaces of the lower posts 300 are exposed. The top surface of the lower semiconductor chip 200 and the top surfaces of the lower posts 300 may be flat and substantially coplanar with each other. The first base layer 210, formed of silicon, included in the lower semiconductor chip 200 may be over-etched compared to the lower molding layer 410. Therefore, during the grinding process or the chemical mechanical polishing process, an upper portion of the first base layer 210 may also be removed. After the upper portion of the first base layer 210 is removed, the top surfaces of the lower posts 300 may be at a higher vertical level than the top surface of the lower semiconductor chip 200. The top surface of the lower semiconductor chip 200 may constitute a recess RS that is recessed toward the first redistribution substrate 100 from the top surface of the lower molding layer 410. The first through vias 240, formed of metal, in the lower semiconductor chip 200 may not be polished. Thus, after the grinding process or the chemical mechanical polishing process, the first through vias 240 may be exposed on a top surface of the first base layer 210. For example, the grinding process or the chemical mechanical polishing process may cause the first through vias 240 to protrude onto the top surface of the first base layer 210.

According to some embodiments, the first through vias 240 of the lower semiconductor chip 200 may not be exposed until the lower molding layer 410 is used to mold the lower semiconductor chip 200. Therefore, an integrated circuit formed in the lower semiconductor chip 200 may be prevented from being contaminated from a metallic material (e.g., copper (Cu)) of the first through vias 240. Accordingly, a method of fabricating a semiconductor package may reduce the occurrence of failure.

Figure 11:
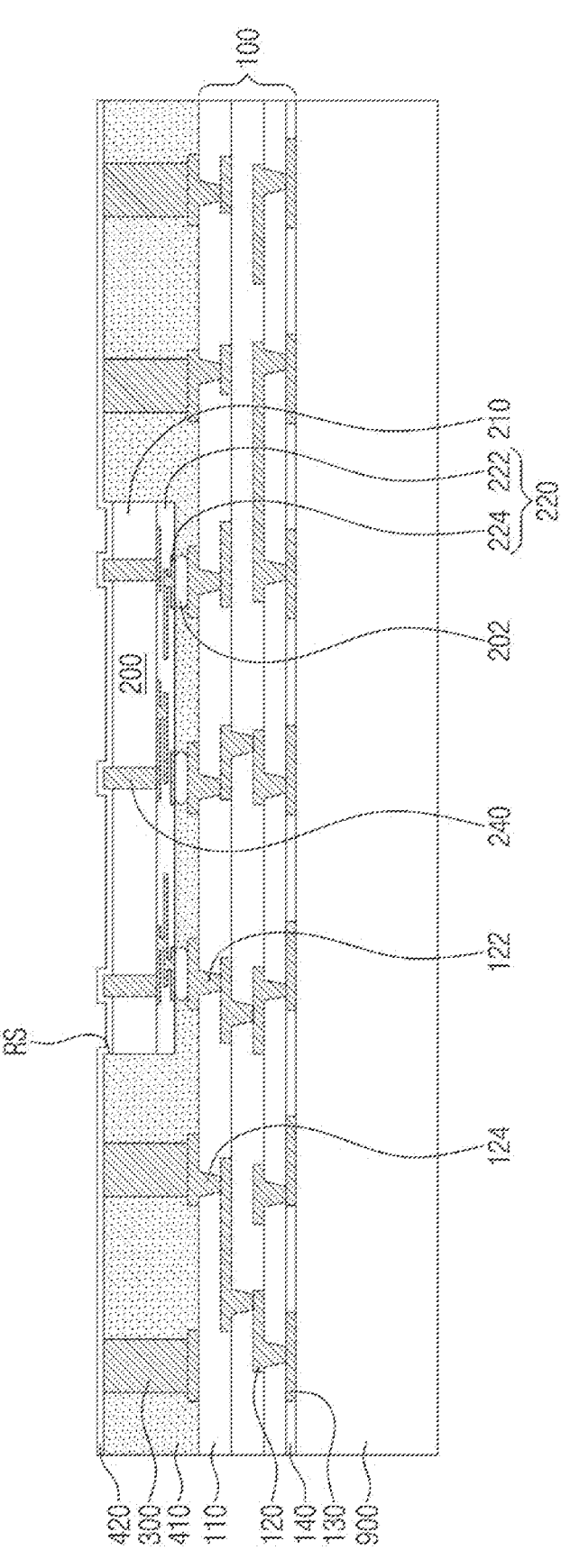

Referring to FIG. 11, an intermediate passivation layer 420 may be formed on the lower molding layer 410. The intermediate passivation layer 420 may be formed to conformally cover the lower molding layer 410 and the lower semiconductor chip 200. For example, the intermediate passivation layer 420 may conformally cover the top surface of the lower molding layer 410, and may also conformally cover an inner sidewall and a bottom surface of the recess RS. In the recess RS, the intermediate passivation layer 420 may conformally cover the first through vias 240 that protrude onto the bottom surface of the recess RS. On the lower molding layer 410, the intermediate passivation layer 420 may cover the top surface of the lower molding layer 410 and the top surfaces of the lower posts 300.

Figure 12:
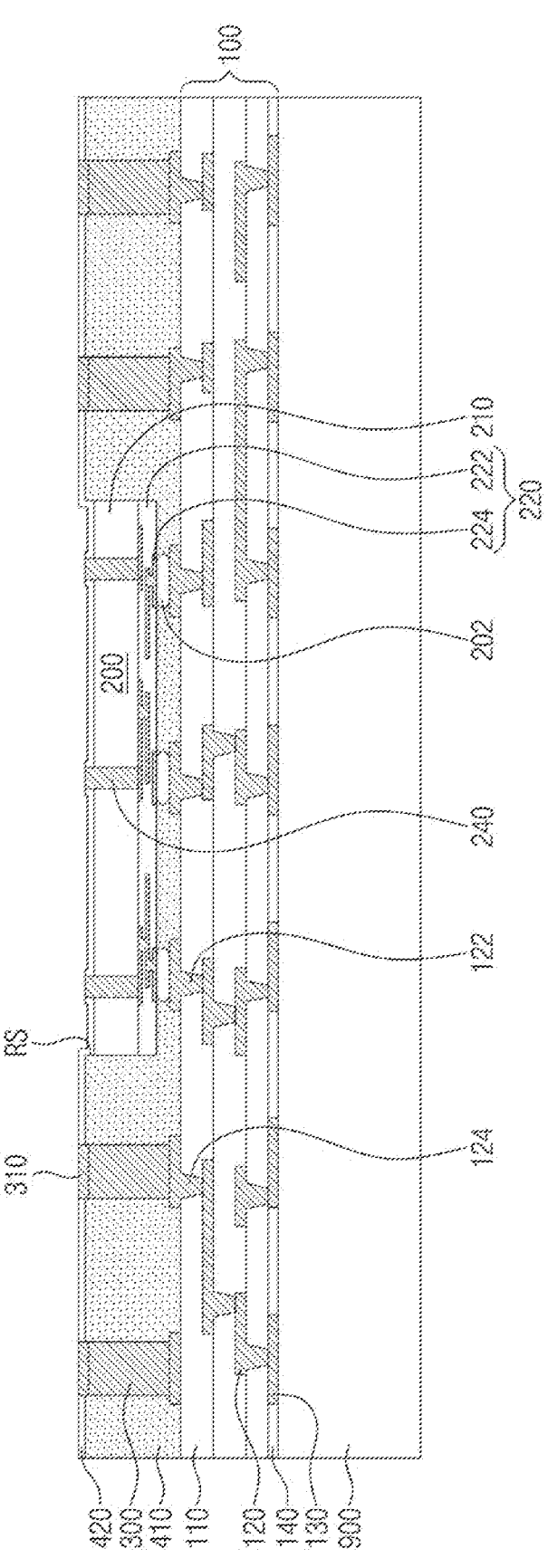

Referring to FIG. 12, post pads 310 may be formed on the lower posts 300. For example, the intermediate passivation layer 420 may be patterned to form openings that expose the top surfaces of the lower posts 300, and then the openings may be filled with a conductive material to form the post pads 310. The openings may penetrate from the intermediate passivation layer 420 to a portion of the top surface of the lower molding layer 410. In this case, the top surface of the lower post 300 may be lower than that of the lower molding layer 410. Alternatively, the openings may penetrate only the intermediate passivation layer 420. In this case, the top surface of the lower post 300 may be located at the same level as that of the top surface of the lower molding layer 410. The process that patterns the intermediate passivation layer 420 may also remove a portion of the intermediate passivation layer 420 positioned on the first through vias 240. Therefore, top surfaces of the first through vias 240 may be exposed.

Figure 13:
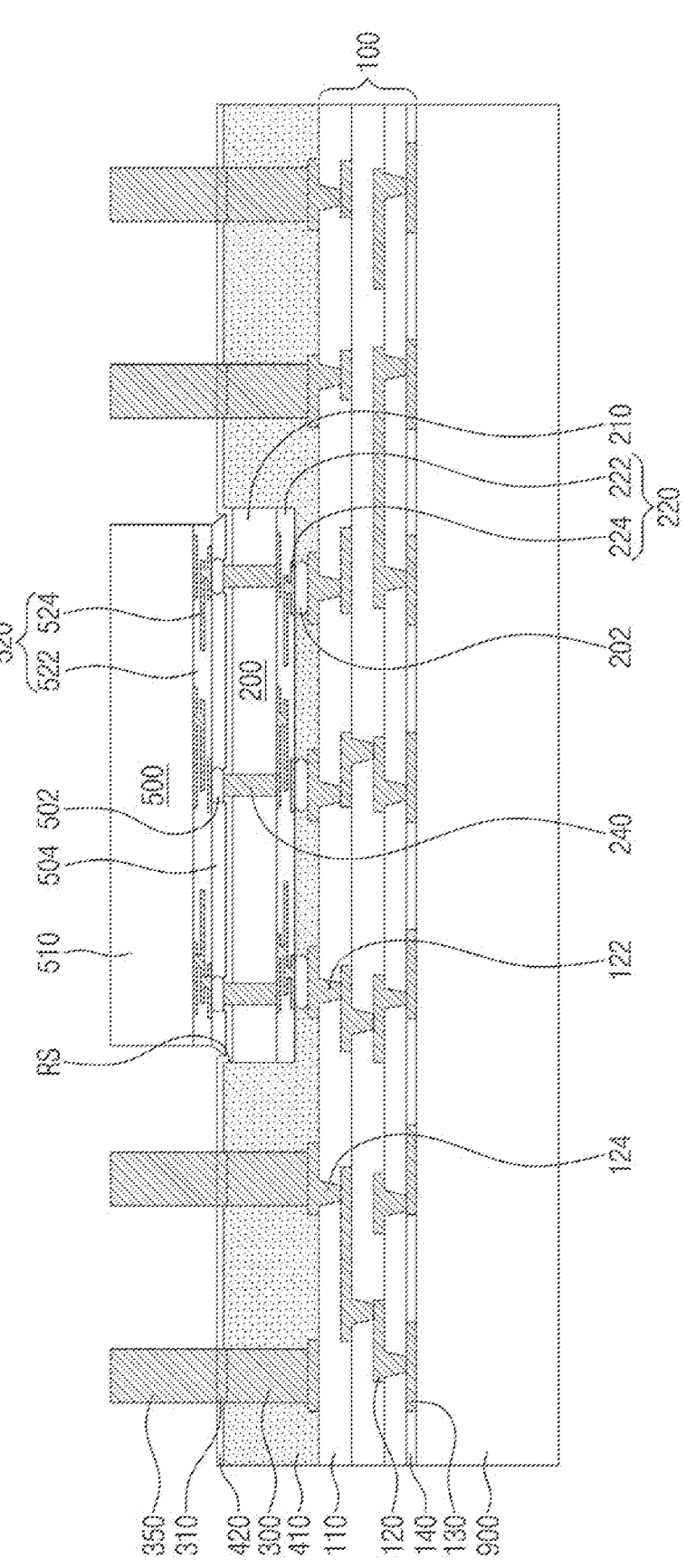

Referring to FIG. 13, a typical process may be performed to form an upper semiconductor chip 500. For example, integrated circuits, such as transistors, may be formed on an active surface of a semiconductor substrate. The semiconductor substrate may correspond to a second base layer 510 of the upper semiconductor chip 500. A second circuit layer 520 may be formed by forming a dielectric pattern 522 and a circuit pattern 524 on the active surface of the semiconductor substrate.

The upper semiconductor chip 500 may be mounted on the lower semiconductor chip 200. The upper semiconductor chip 500 may be mounted in a flip-chip manner. For example, second chip connection terminals 502 may be provided on chip pads of the upper semiconductor chip 500, an underfill layer 504 may be provided on the second circuit layer 520 of the upper semiconductor chip 500 so as to surround the second chip connection terminals 502, and the upper semiconductor chip 500 may be placed on the lower semiconductor chip 200 to allow the second chip connection terminals 502 to rest on the first through vias 240 of the lower semiconductor chip 200 that protrude onto the intermediate passivation layer 420. Afterwards, the second chip connection terminals 502 may undergo a reflow process to mount the upper semiconductor chip 500 on the lower semiconductor chip 200.

One or more upper posts 350 may be formed on the intermediate passivation layer 420. For example, a sacrificial layer may be formed on the intermediate passivation layer 420, the sacrificial layer may be etched to form through holes that expose the post pads 310 of the lower posts 300, and then the through holes may be filled with a conductive material to form the upper posts 350. After that, the sacrificial layer may be removed.

Figure 14:
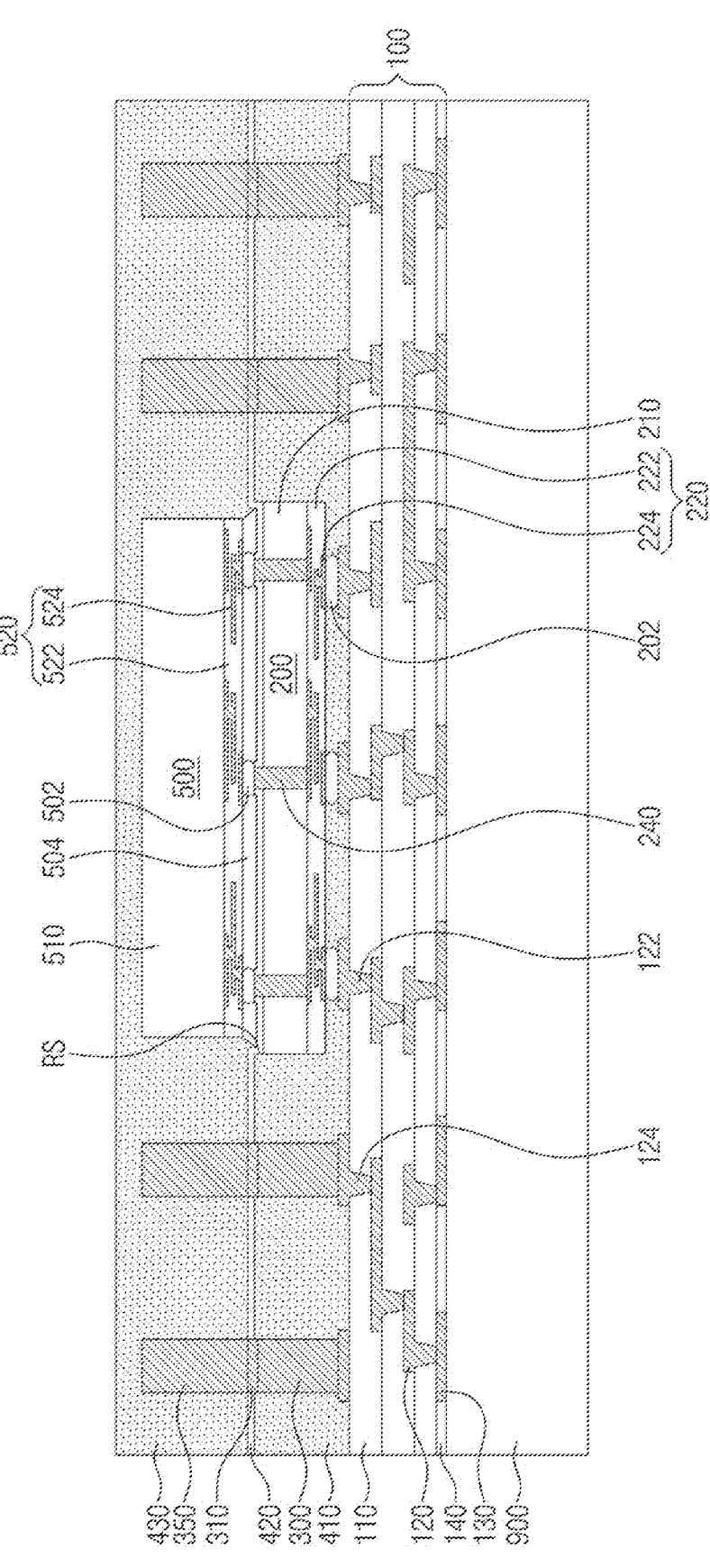

Referring to FIG. 14, an upper molding layer 430 may be formed on the intermediate passivation layer 420. For example, the upper molding layer 430 may be formed by depositing on the intermediate passivation layer 420 a dielectric material that covers the upper semiconductor chip 500 and the upper posts 350.

Figure 15:
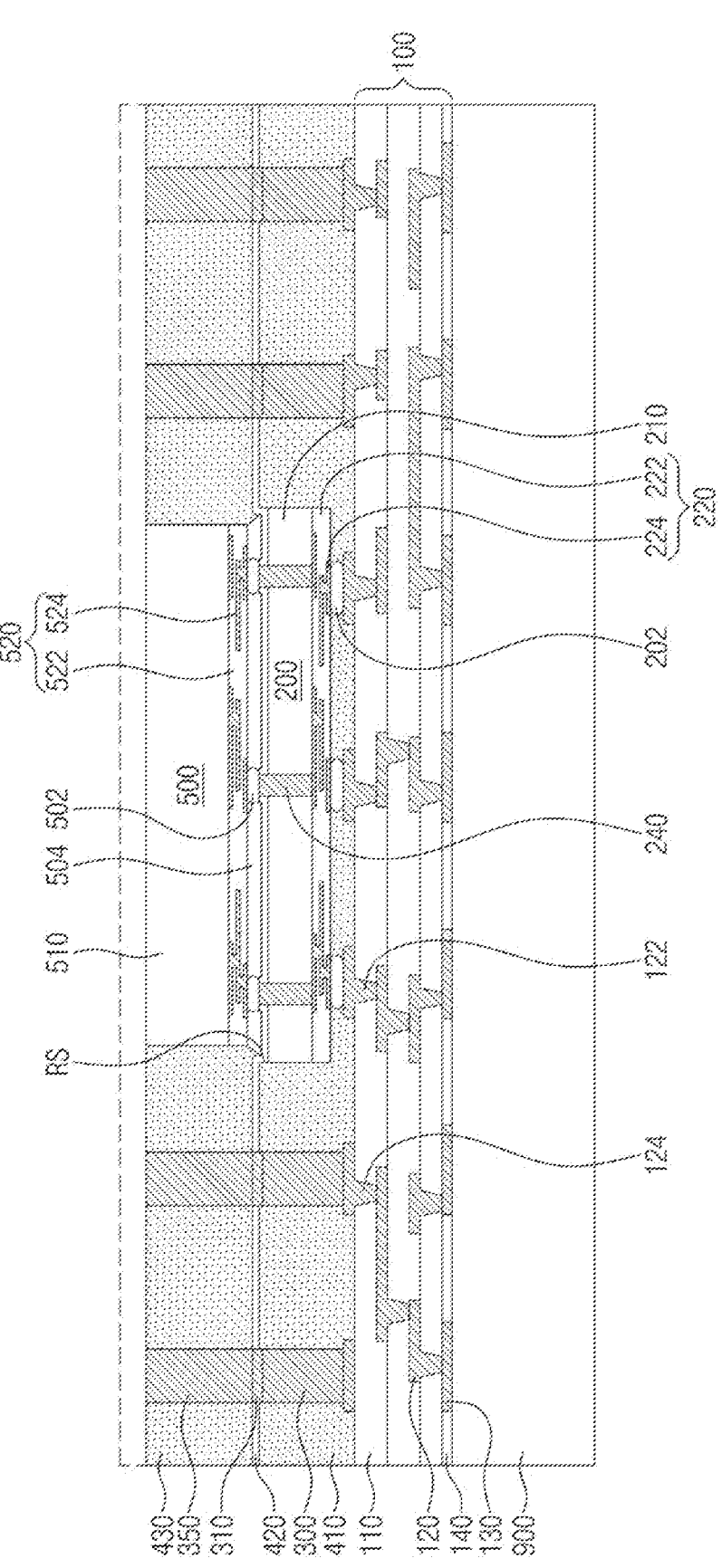

Referring to FIG. 15, a portion of the upper molding layer 430 may be removed. For example, a grinding process or a chemical mechanical polishing (CMP) process may be performed on a top surface of the upper molding layer 430. The grinding process or the chemical mechanical polishing process may continue until a top surface of the upper semiconductor chip 500 is exposed and top surfaces of the upper posts 350 are exposed. The top surface of the upper semiconductor chip 500 and the top surfaces of the upper posts 350 may be flat and substantially coplanar with each other.

Figure 16:
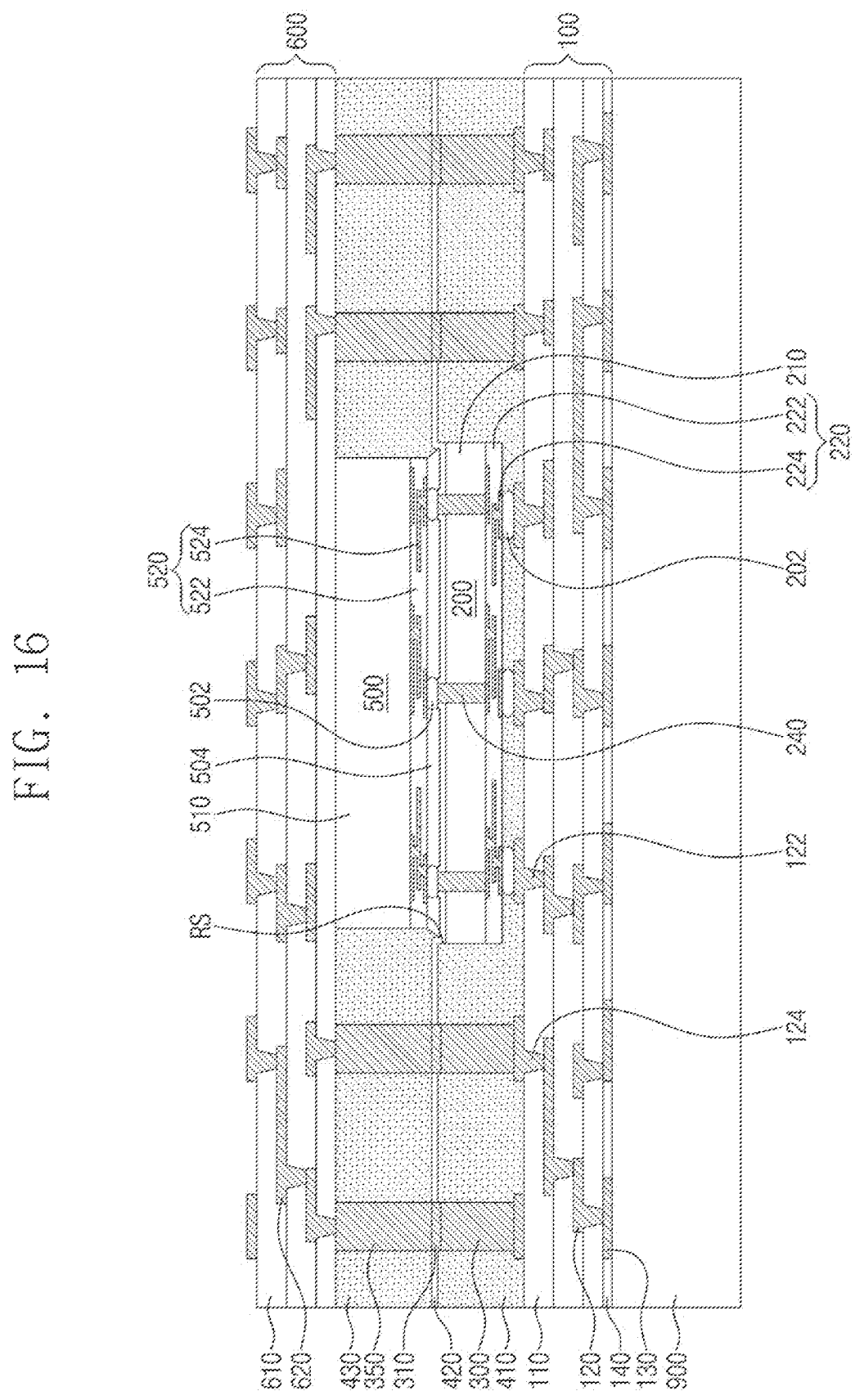

Referring to FIG. 16, a second redistribution substrate 600 may be formed on the upper molding layer 430. For example, a dielectric material may be deposited to form a dielectric layer on the upper molding layer 430, the dielectric layer may be patterned to expose the upper posts 350 and to form a second substrate dielectric pattern 610, a conductive layer may be formed on the second substrate dielectric pattern 610, and the conductive layer may be patterned to form a second substrate wiring pattern 620. As such, a single second substrate wiring layer may be formed. The formation of the second substrate wiring layer may be repeatedly performed to form the second redistribution substrate 600.

Referring back to FIG. 1, the carrier substrate 900 may be removed. Therefore, a bottom surface of the first redistribution substrate 100 may be exposed. Thereafter, external terminals 150 may be provided on external pads 130 of the first redistribution substrate 100.

It may thus be possible to fabricate a semiconductor package discussed with reference to FIG. 1.

According to example embodiments of the present inventive concepts, only one carrier substrate 900 may be used to fabricate a semiconductor package having a structure in which the lower semiconductor chip 200 and the upper semiconductor chip 500 are stacked. Accordingly, it may be possible to provide a simplified fabrication method for semiconductor packages.

Furthermore, because heat is easily discharged from the semiconductor package, a heat-induced intermetallic compound may be prevented from being formed in the first chip connection terminals 202 between the lower semiconductor chip 200 and the upper semiconductor chip 500. Accordingly, a method of fabricating a semiconductor package may reduce the occurrence of failure.

When a through hole is formed in a molding layer and then a post is formed in the through hole, an increase in thickness of the molding layer may cause an increase in width of the through hole. For example, there may be a limitation in aspect ratio of the through hole formed in the molding layer. According to example embodiments of the present inventive concepts, after the lower posts 300 are formed in the lower molding layer 410, the upper posts 350 may be formed in the upper molding layer 430 on the lower posts 300. Thus, a high aspect ratio may be given to vertical connectors in which the lower posts 300 and the upper posts 350 are connected to each other, and the lower and upper molding layers 410 and 430 may have an increased total thickness. Accordingly, the upper semiconductor chip 500 may be easily formed to have a large thickness, and a semiconductor package may be fabricated to have increased thermal radiation efficiency.

FIGS. 17 to 23 illustrate cross-sectional views showing a method of fabricating a semiconductor package according to example embodiments of the present inventive concepts.

Figure 17:
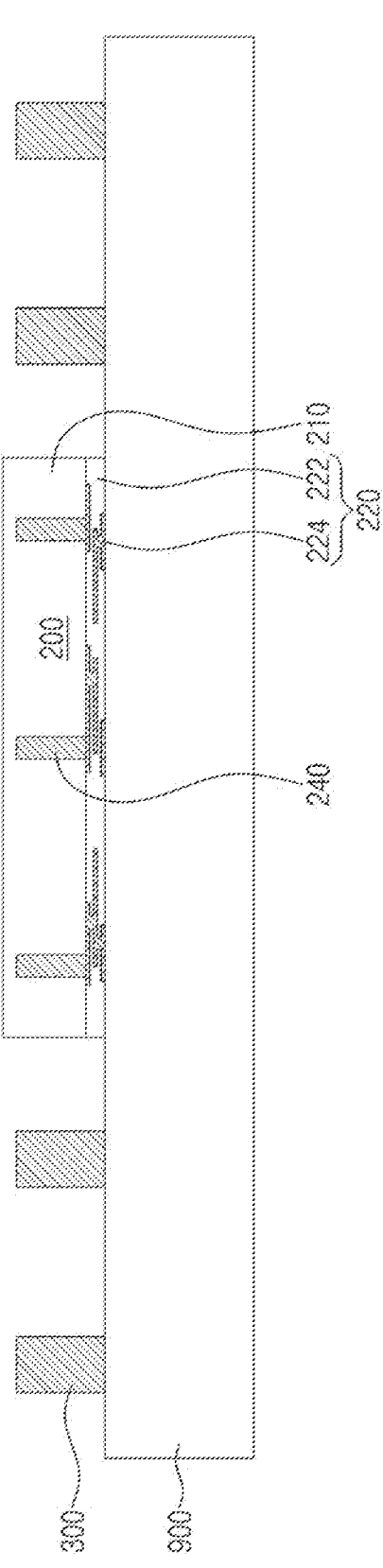

Referring to FIG. 17, a first carrier substrate 900 may be provided. The first carrier substrate 900 may be a dielectric substrate including glass or polymer, or may be a conductive substrate including metal. Although not shown, an adhesive member may be provided on a top surface of the first carrier substrate 900. For example, the adhesive member may include a glue tape.

A lower semiconductor chip 200 may be provided on the first carrier substrate 900. The lower semiconductor chip 200 may correspond to the lower semiconductor chip 200 formed by the process discussed with reference to FIG. 8. The lower semiconductor chip 200 may be provided to allow a first circuit layer 220 to contact the first carrier substrate 900. The lower semiconductor chip 200 may be disposed on a central area of the first carrier substrate 900.

One or more lower posts 300 may be provided on the first carrier substrate 900. The lower posts 300 may contact the first carrier substrate 900. The lower posts 300 may be disposed on an edge area of the first carrier substrate 900. For example, the lower posts 300 may be disposed around the lower semiconductor chip 200.

Figure 18:
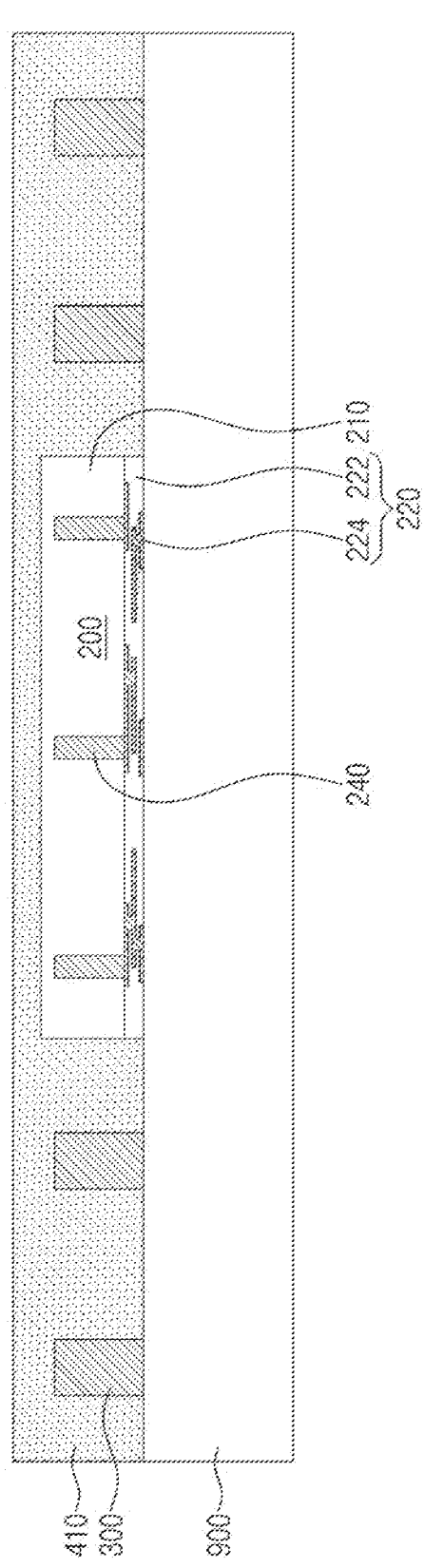

Referring to FIG. 18, a lower molding layer 410 may be formed on the first carrier substrate 900. For example, the lower molding layer 410 may be formed by depositing on the first carrier substrate 900 a dielectric material that covers the lower semiconductor chip 200 and the lower posts 300.

Figure 19:
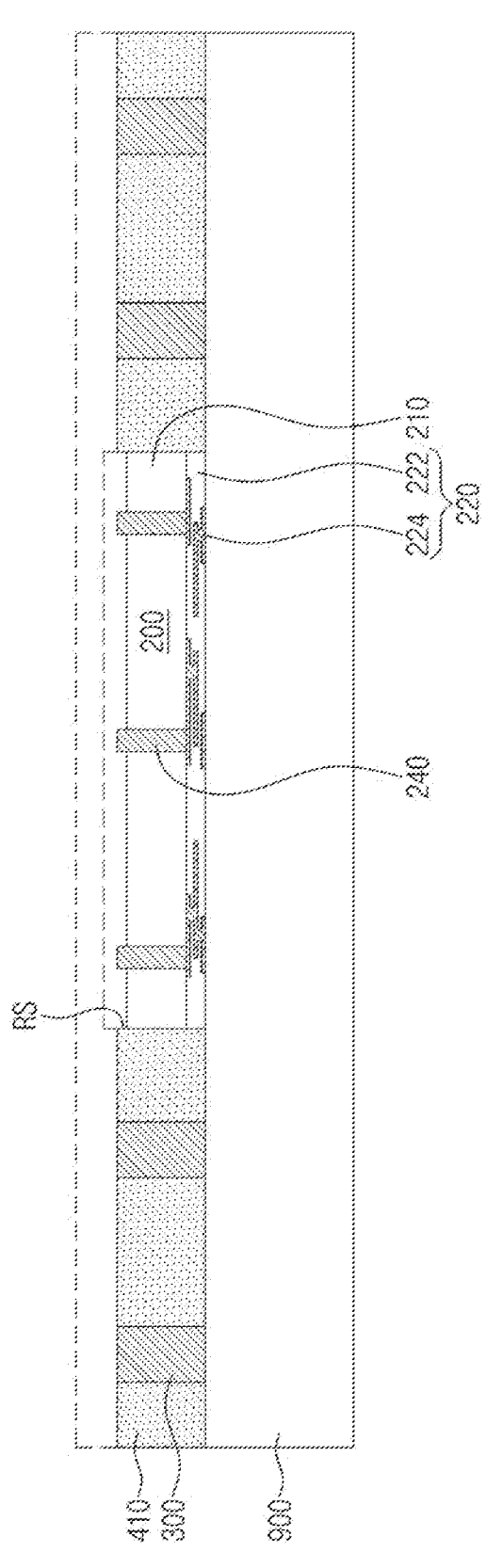

Referring to FIG. 19, a grinding process or a chemical mechanical polishing (CMP) process may be performed on a top surface of the lower molding layer 410. The grinding process or the chemical mechanical polishing may continue until a top surface of the lower semiconductor chip 200 is exposed and top surfaces of the lower posts 300 are exposed. The top surface of the lower semiconductor chip 200 and the top surfaces of the lower posts 300 may be flat and substantially coplanar with each other. During the grinding process or the chemical mechanical polishing process, an upper portion of the first base layer 210 may also be removed. After the upper portion of the first base layer 210 is removed, the top surfaces of the lower posts 300 may be at a higher vertical level than the top surface of the lower semiconductor chip 200. The top surface of the lower semiconductor chip 200 may constitute a recess RS that is recessed toward the first redistribution substrate 100 from the top surface of the lower molding layer 410. After the grinding process or the chemical mechanical polishing process, the first through vias 240 may be exposed on a top surface of the first base layer 210. For example, the grinding process or the chemical mechanical polishing process may cause the first through vias 240 to protrude onto the top surface of the first base layer 210.

Figure 20:
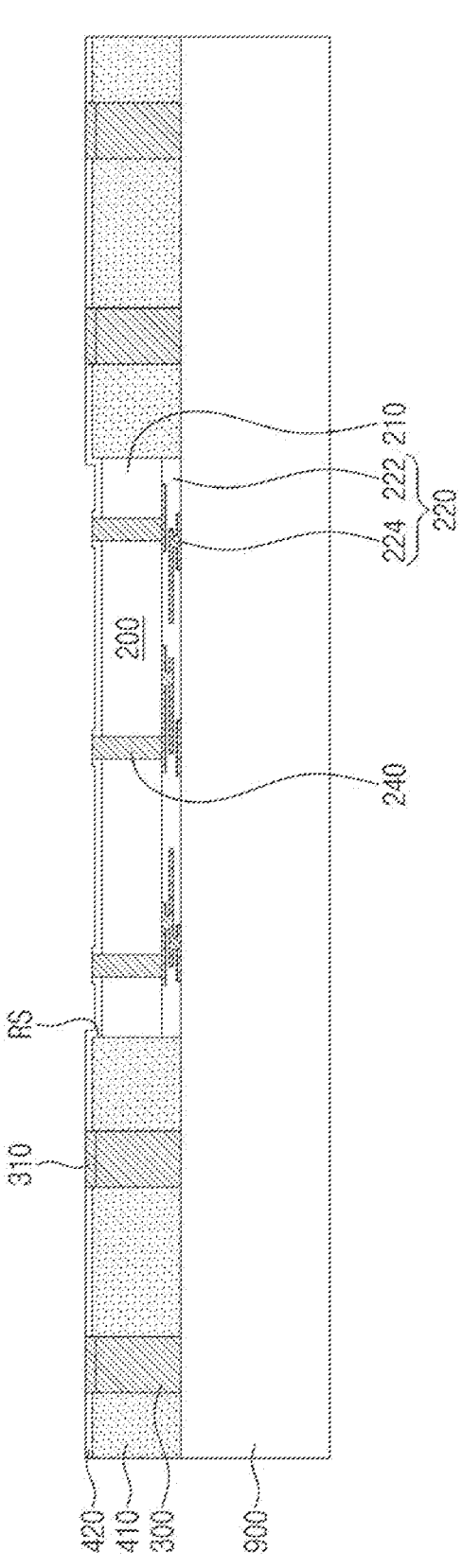

Referring to FIG. 20, an intermediate passivation layer 420 may be formed on the lower molding layer 410. The intermediate passivation layer 420 may conformally cover the top surface of the lower molding layer 410, and may also conformally cover an inner sidewall and a bottom surface of the recess RS. In the recess RS, the intermediate passivation layer 420 may conformally cover the first through vias 240 that protrude onto the bottom surface of the recess RS. On the lower molding layer 410, the intermediate passivation layer 420 may cover the top surface of the lower molding layer 410 and the top surfaces of the lower posts 300.

Post pads 310 may be formed on the lower posts 300. For example, the intermediate passivation layer 420 may be patterned to form openings that expose the top surfaces of the lower posts 300, and then the openings may be filled with a conductive material to form the post pads 310. The openings may penetrate from the intermediate passivation layer 420 to a portion of the top surface of the lower molding layer 410. Alternatively, the openings may penetrate only the intermediate passivation layer 420. The process that patterns the intermediate passivation layer 420 may also remove a portion of the intermediate passivation layer 420 positioned on the first through vias 240. Therefore, top surfaces of the first through vias 240 may be exposed.

Figure 21:
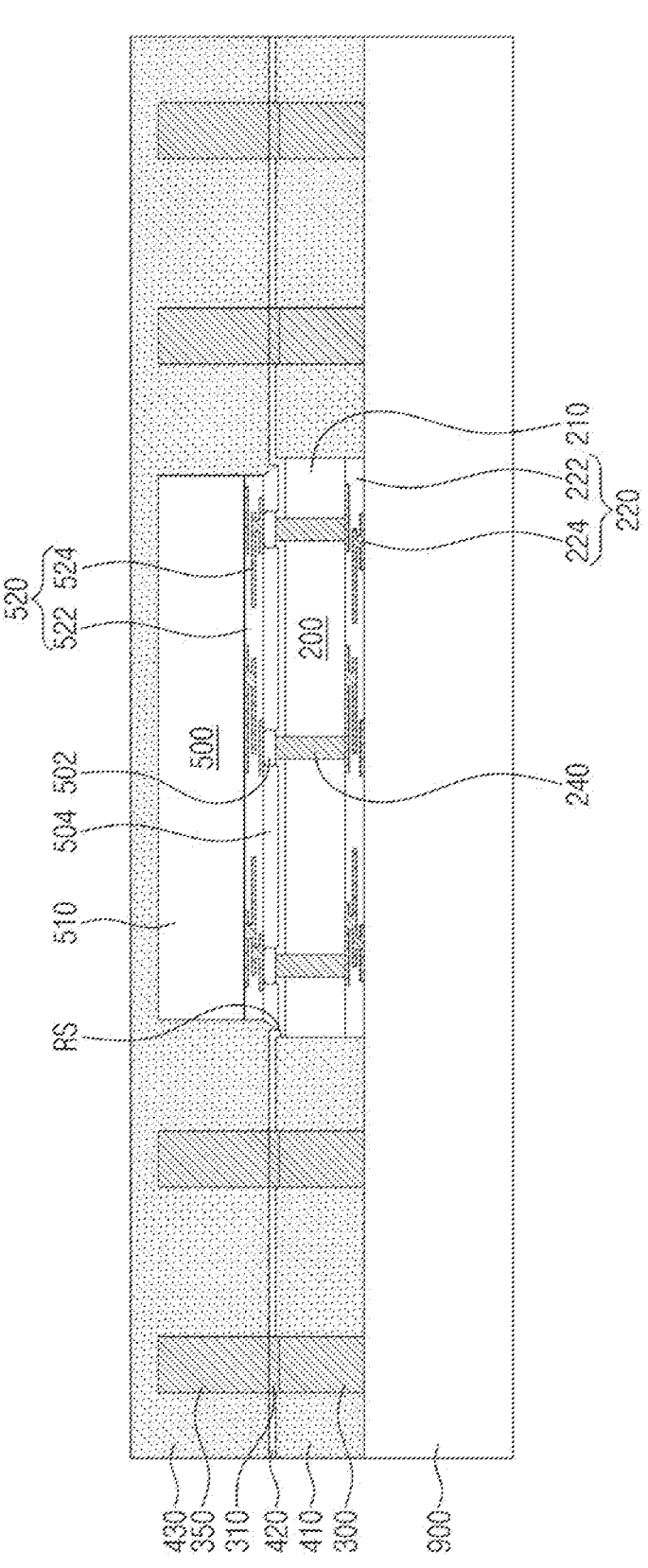

Referring to FIG. 21, an upper semiconductor chip 500 may be mounted on the lower semiconductor chip 200. For example, second chip connection terminals 502 may be provided on chip pads of the upper semiconductor chip 500, an underfill layer 504 may be provided on a second circuit layer 520 of the upper semiconductor chip 500 so as to surround the second chip connection terminals 502, and the upper semiconductor chip 500 may be placed on the lower semiconductor chip 200 to allow the second chip connection terminals 502 to rest on the first through vias 240 of the lower semiconductor chip 200 that protrude onto the intermediate passivation layer 420. Afterwards, the second chip connection terminals 502 may undergo a reflow process to mount the upper semiconductor chip 500 on the lower semiconductor chip 200.

One or more upper posts 350 may be formed on the intermediate passivation layer 420. For example, a sacrificial layer may be formed on the intermediate passivation layer 420, the sacrificial layer may be etched to form through holes that expose the post pads 310 of the lower posts 300, and then the through holes may be filled with a conductive material to form the upper posts 350. After that, the sacrificial layer may be removed.

An upper molding layer 430 may be formed on the intermediate passivation layer 420. For example, the upper molding layer 430 may be formed by depositing on the intermediate passivation layer 420 a dielectric material that covers the upper semiconductor chip 500 and the upper posts 350.

Figure 22:
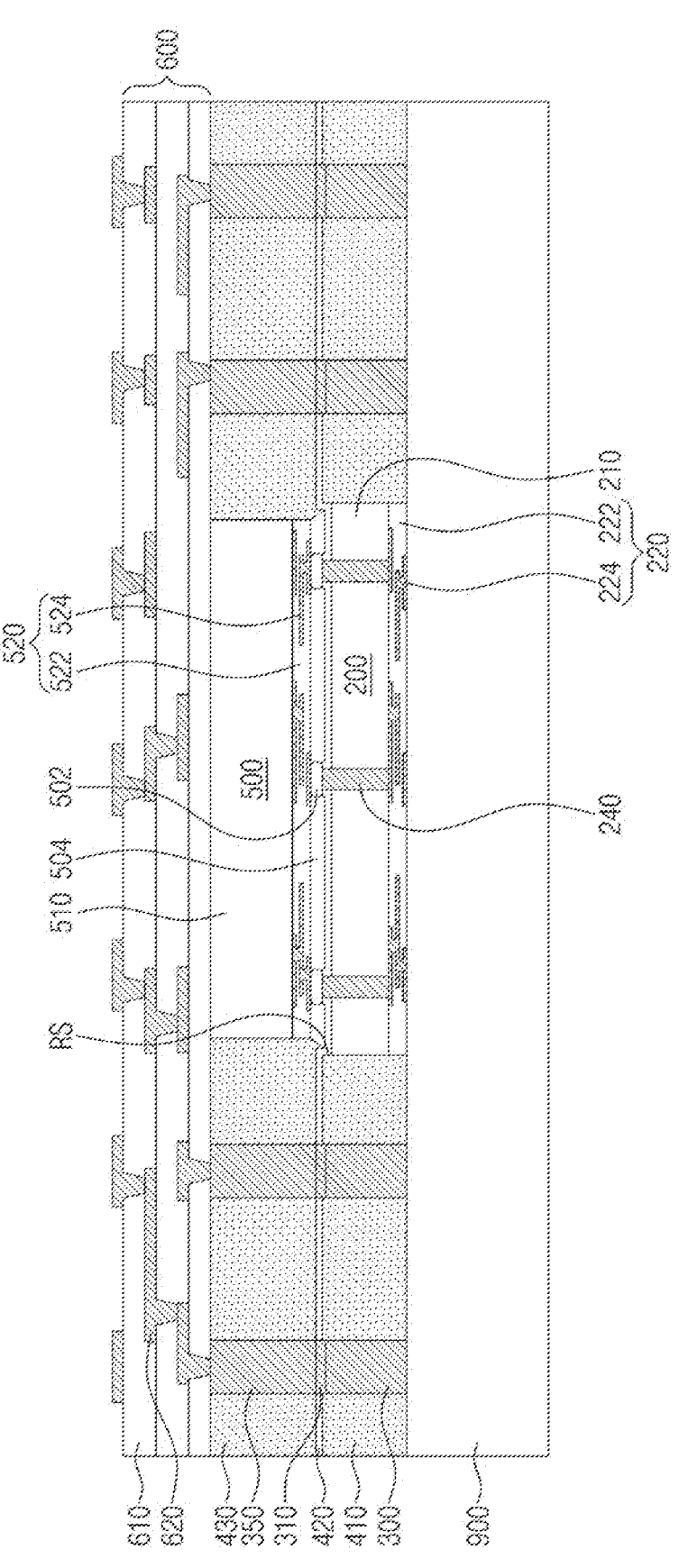

Referring to FIG. 22, a portion of the upper molding layer 430 may be removed. For example, a grinding process or a chemical mechanical polishing (CMP) process may be performed on a top surface of the upper molding layer 430. The grinding process or the chemical mechanical polishing process may continue until a top surface of the upper semiconductor chip 500 is exposed and top surfaces of the upper posts 350 are exposed. The top surface of the upper semiconductor chip 500 and the top surfaces of the upper posts 350 may be flat and substantially coplanar with each other.

A second redistribution substrate 600 may be formed on the upper molding layer 430. For example, a dielectric material may be deposited to form a dielectric layer on the upper molding layer 430, the dielectric layer may be patterned to expose the upper posts 350 and to form a second substrate dielectric pattern 610, a conductive layer may be formed on the second substrate dielectric pattern 610, and the conductive layer may be patterned to form a second substrate wiring pattern 620. As such, a single second substrate wiring layer may be formed. The formation of the second substrate wiring layer may be repeatedly performed to form the second redistribution substrate 600.

Figure 23:
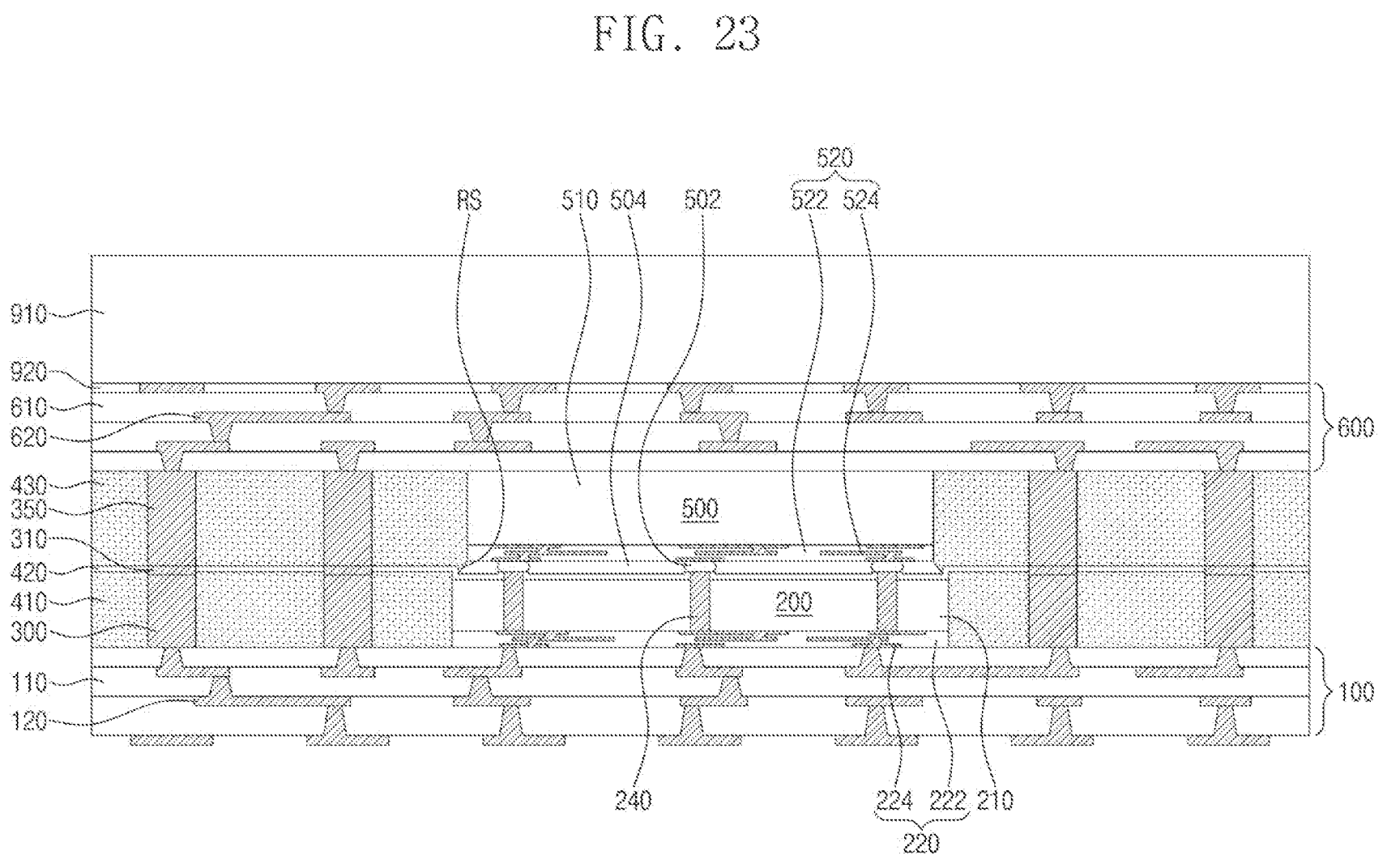

Referring to FIG. 23, the first carrier substrate 900 may be provided. Therefore, a bottom surface of the lower semiconductor chip 200 may be exposed, a bottom surface of the lower molding layer 410 may be exposed, and bottom surfaces of the lower posts 300 may be exposed.

A second carrier substrate 910 may be provided on the second redistribution substrate 600. The second carrier substrate 910 may be a dielectric substrate including glass or polymer, or may be a conductive substrate including metal. Although not shown, an adhesive member 920 may be provided on a bottom surface of the second carrier substrate 910. For example, the adhesive member 920 may be used to attach the second carrier substrate 910 onto the second redistribution substrate 600. For example, the adhesive member 920 may include a glue tape.

A first redistribution substrate 100 may be formed on the bottom surface of the lower molding layer 410. For example, a dielectric material may be deposited to form a dielectric layer below the lower molding layer 410 and the lower semiconductor chip 200, the dielectric layer may be patterned to expose the lower posts 300 and to form a first substrate dielectric pattern 110, a conductive layer may be formed on the first substrate dielectric pattern 110, and the conductive layer may be patterned to form a first substrate wiring pattern 120. As such, a single first substrate wiring layer may be formed. The formation of the first substrate wiring layer may be repeatedly performed to form a first redistribution substrate 100.

Referring back to FIG. 4, the second carrier substrate 910 and the adhesive member 920 may be removed. Thereafter, external terminals 150 may be provided on external pads 130 of the first redistribution substrate 100.

It may thus be possible to fabricate a semiconductor package discussed with reference to FIG. 4.

In a semiconductor package according to example embodiments of the present inventive concepts, because an upper semiconductor chip has a large thickness, heat generated from semiconductor chips may be easily discharged through the upper semiconductor chip. In addition, because a lower post and an upper post are used to provide a multi-layered vertical connector that vertically connects redistribution substrates to each other, it may be possible to easily form the vertical connector having a high aspect ratio. Accordingly, the upper semiconductor chip may be easily formed to have a large thickness, and the semiconductor package may increase in thermal radiation efficiency. Moreover, because heat is easily discharged from semiconductor chips, a heat-induced intermetallic compound may be suppressed from being formed in connection terminals between the semiconductor chips. As a result, the semiconductor package may have increased structural stability and improved operating stability.

In a method of fabricating a semiconductor package according to example embodiments of the present inventive concepts, only one carrier substrate may be used to form a semiconductor package having a structure in which semiconductor chips are stacked. Accordingly, it may be possible to provide a simplified fabrication method for semiconductor packages. In addition, a high aspect ratio may be given to a vertical connection in which lower and upper posts are connected, and molding layers may have an increased total thickness. Accordingly, an upper semiconductor chip may be easily formed to have a large thickness, and a semiconductor package may be fabricated to have increased thermal radiation efficiency.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a first redistribution substrate;
a lower semiconductor chip on the first redistribution substrate and including a through via therein;
a lower molding layer on the first redistribution substrate and surrounding the lower semiconductor chip;
a lower post on the first redistribution substrate and laterally spaced apart from the lower semiconductor chip, the lower post vertically penetrating the lower molding layer;
an upper semiconductor chip on the lower semiconductor chip and coupled to the through via;
an upper molding layer on the lower molding layer and surrounding the upper semiconductor chip;
an upper post on the lower molding layer and laterally spaced apart from the upper semiconductor chip, the upper post vertically penetrating the upper molding layer and being coupled to the lower post; and
a second redistribution substrate on the upper molding layer and coupled to the upper post,
wherein the lower molding layer directly contacts a side surface of the lower post and a side surface of the lower semiconductor chip
wherein a top surface of the lower molding layer is at a level higher than a level of a top surface of the lower semiconductor chip, and
wherein the lower molding layer exposes the top surface of the lower semiconductor chip.

2. The semiconductor package of claim 1,
wherein the top surface of the lower semiconductor chip constitutes a recess that is recessed toward the first redistribution substrate from the top surface of the lower molding layer, and
wherein when viewed in a plan view, the upper semiconductor chip is in the recess.

3. The semiconductor package of claim 2, wherein a width of the upper semiconductor chip is less than a width of the lower semiconductor chip.

4. The semiconductor package of claim 3, wherein an entirety of the upper semiconductor chip vertically overlaps the lower semiconductor chip.

5. The semiconductor package of claim 1, further comprising:
a passivation layer that directly contacts the top surface of the lower semiconductor chip,
wherein the passivation layer extends between the lower molding layer and the upper molding layer, and
wherein a material of the passivation layer is different from a material of the lower molding layer and a material of the upper molding layer.

6. The semiconductor package of claim 5,
wherein the passivation layer directly contacts the top surface of the lower molding layer,
wherein the lower post includes a post pad on an upper portion of the lower post, and
wherein the post pad vertically penetrates the passivation layer to be connected to the upper post.

7. The semiconductor package of claim 5,
wherein on the top surface of the lower semiconductor chip, the through via of the lower semiconductor chip vertically penetrates the passivation layer to be exposed on a top surface of the passivation layer, and
wherein the upper semiconductor chip is connected to the through via through a first connection terminal between the upper semiconductor chip and the lower semiconductor chip.

8. The semiconductor package of claim 1, wherein a thickness of the upper semiconductor chip is greater than a thickness of the lower semiconductor chip.

9. The semiconductor package of claim 8, wherein a height of the lower post is substantially the same as a height of the upper post.

10. The semiconductor package of claim 8, wherein, on a side of the lower semiconductor chip, a thickness of the lower molding layer is substantially the same as a thickness of the upper molding layer.

11. The semiconductor package of claim 1, wherein the lower semiconductor chip is mounted on the first redistribution substrate through a second connection terminal between the first redistribution substrate and the lower semiconductor chip.

12. The semiconductor package of claim 1,
wherein a bottom surface of the lower semiconductor chip directly contacts a top surface of the first redistribution substrate, and
wherein a chip pad of the lower semiconductor chip directly contacts a wiring pattern of the first redistribution substrate.

13. The semiconductor package of claim 1, wherein the upper molding layer directly contacts a lateral surface of the upper semiconductor chip.

14. The semiconductor package of claim 1, wherein the lower post and the upper post include different materials from each other.

15. The semiconductor package of claim 1,
wherein the lower semiconductor chip is one of a plurality of lower semiconductor chips, and
wherein the plurality of lower semiconductor chips are horizontally spaced apart from each other on the first redistribution substrate.

16. A semiconductor package, comprising:
a first redistribution substrate;
an external terminal on a bottom surface of the first redistribution substrate;
a lower semiconductor chip on the first redistribution substrate and including a through via therein;
a lower post on the first redistribution substrate and laterally spaced apart from the lower semiconductor chip, the lower post being coupled to the first redistribution substrate;
a lower molding layer on the first redistribution substrate and surrounding the lower semiconductor chip and directly contacting a side surface of the lower post,
an upper semiconductor chip on the lower semiconductor chip and coupled to the through via;
an upper post on the lower post and laterally spaced apart from the upper semiconductor chip;
a second redistribution substrate on the upper semiconductor chip and the upper post, the second redistribution substrate being coupled to the upper post; and
a passivation layer that directly contacts a top surface of the lower semiconductor chip and a top surface of the lower molding layer,
wherein the lower post penetrates the passivation layer to be connected to the upper post, and
wherein a material of the passivation layer is different from a material of the lower molding layer.

17. The semiconductor package of claim 16, further comprising:
an upper molding layer on the lower molding layer and surrounding the upper semiconductor chip,
wherein the passivation layer directly contacts a bottom surface of the upper molding layer,
wherein the lower post vertically penetrates the lower molding layer to be connected to the first redistribution substrate, and wherein the upper post vertically penetrates the upper molding layer to be connected to the lower post.

18. The semiconductor package of claim 16, wherein the top surface of the lower molding layer is at a level higher than a level of the top surface of the lower semiconductor chip.

19. The semiconductor package of claim 17, wherein the passivation layer extends from the top surface of the lower semiconductor chip into a space between the lower molding layer and the upper molding layer.

20. A semiconductor package, comprising:
a first redistribution substrate;
a lower semiconductor chip on the first redistribution substrate and including a through via therein;
a lower molding layer on the first redistribution substrate and surrounding the lower semiconductor chip;
a passivation layer that directly contacts a top surface of the lower semiconductor chip and a top surface of the lower molding layer, the through via of the lower semiconductor chip vertically penetrating the passivation layer to be exposed on a top surface of the passivation layer;
an upper semiconductor chip on the passivation layer on the lower semiconductor chip, the upper semiconductor chip being coupled to the through via;
an upper molding layer on the passivation layer and surrounding the upper semiconductor chip; and
a second redistribution substrate on the upper molding layer,
wherein the top surface of the lower semiconductor chip constitutes a recess that is recessed toward the first redistribution substrate from the top surface of the lower molding layer,
wherein the passivation layer directly contacts a bottom surface of the upper molding layer, and
wherein a material of the passivation layer is different from a material of the lower molding layer and a material of the upper molding layer.

* * * * *